US006097906A

United States Patent [19]

Matsuzaki et al.

[11] Patent Number: 6,097,906

[45] Date of Patent: Aug. 1, 2000

[54] ELECTROPHOTOGRAPHIC IMAGE FORMING APPARATUS HAVING A MAIN ASSEMBLY CONNECTOR AND A PROCESS CARTRIDGE HAVING A CARTRIDGE CONNECTOR ELECTRICALLY CONNECTABLE WITH THE MAIN ASSEMBLY CONNECTOR

[75] Inventors: Hiroomi Matsuzaki, Mishima; Tadayuki Tsuda, Susono; Hiroshi Yukimachi, Shizuoka-ken; Kazunori Takashima, Mishima, all of Japan

[73] Assignee: Canon Kabushiki Kaisha, Tokyo, Japan

[21] Appl. No.: 09/024,271

[22] Filed: Feb. 17, 1998

[30] Foreign Application Priority Data

Feb. 14, 1997 [JP] Japan .................................... 9-047316

[51] Int. Cl.[7] .................................... G03F 15/00

[52] U.S. Cl. .................................... 399/90; 399/111

[58] Field of Search .................................... 399/111, 113, 399/90, 114

[56] References Cited

U.S. PATENT DOCUMENTS

| | | | |
|---|---|---|---|
| 4,961,088 | 10/1990 | Gilliland et al. | 399/25 |
| 5,223,893 | 6/1993 | Ikemoto et al. | 355/200 |
| 5,331,372 | 7/1994 | Tsuda et al. | 355/200 |
| 5,475,470 | 12/1995 | Sasago et al. | 355/210 |
| 5,510,878 | 4/1996 | Noda et al. | 355/211 |
| 5,583,613 | 12/1996 | Kobayashi et al. | 355/200 |
| 5,623,328 | 4/1997 | Tsuda et al. | 399/111 |
| 5,659,847 | 8/1997 | Tsuda et al. | 399/113 |
| 5,669,042 | 9/1997 | Kobayashi et al. | 399/111 |
| 5,873,012 | 2/1999 | Miyabe et al. | 399/90 |
| 5,937,239 | 4/1999 | Watanabe et al. | 399/111 |

*Primary Examiner*—Joan Pendegrass
*Attorney, Agent, or Firm*—Fitzpatrick, Cella, Harper & Scinto

[57] ABSTRACT

A process cartridge which is detachably mountable to a main assembly of an image forming apparatus, the process cartridge includes an electrophotographic photosensitive member, wherein the process cartridge is detachably mountable to the main assembly in the direction substantially perpendicular to an axis of an electrophotograpic photosensitive drum; process device actable on the photosensitive member; a connector having a memory; a positioning member disposed coaxially with the photosensitive member and engageable with a positioning groove provided in the main assembly; a regulating portion contactable to a fixed portion of the main assembly to regulate rotation of the the process cartridge about the positioning member when the process cartridge is mounted to the main assembly; wherein the connector is disposed above the positioning member.

26 Claims, 25 Drawing Sheets

ELECTROPHOTOGRAPHIC IMAGE FORMING APPARATUS HAVING A MAIN ASSEMBLY CONNECTOR AND A PROCESS CARTRIDGE HAVING A CARTRIDGE CONNECTOR ELECTRICALLY CONNECTABLE WITH THE MAIN ASSEMBLY CONNECTOR

FIELD OF THE INVENTION AND RELATED ART

The present invention relates to a process cartridge and an electrophotographic image forming apparatus usable with the process cartridge.

Here, the electrophotographic image forming apparatus includes an electrophotographic copying machine, an electrophotographic printer (for example, LED printer, laser beam printer), an electrophotographic facsimile machine, an electrophotographic word processor, and the like.

The process cartridge a cartridge having, as a unit, an electrophotographic photosensitive member, and charging means, developing means, and cleaning means, which is detachably mountable to the main assembly of an image forming apparatus. It may include as a unit, an electrophotographic photosensitive member and at least one of charging means, developing means, and cleaning means. It may include as a unit, developing means and an electrophotographic photosensitive member.

An image forming apparatus using an electrophotographic process is known which is used with the process cartridge. This is advantageous in that the maintenance operation can be, in effect, carried out by the users thereof without expert service persons, and therefore, the operativity can be remarkably improved. Therefore, this type of apparatus is now widely used.

In the process cartridge, improvement in the operativity in mounting and demounting the cartridge relative to the main assembly of the image forming apparatus, is desired.

The above described process cartridge is provided with guide portions, which are located one for one on the lateral walls of the process cartridge, and are guided along the guide grooves provided in the main assembly of an image forming apparatus, so that the process cartridge is smoothly installed into, or removed from, an image forming apparatus.

It has been proposed that a process cartridge should be provided with a memory element for storing the requirement for the cartridge usage, the history of the process cartridge usage, and the like, and a connector, which connects this memory element to the controlling apparatus of the main assembly of an image forming apparatus as the process cartridge is installed into the main assembly of an image forming apparatus, so that a certain portion of the control executed by the controlling apparatus is executed in accordance with the information stored in the memory element.

The present invention is one of the results of further development of the prior technologies described above.

SUMMARY OF THE INVENTION

The object of the present invention is to provide a process cartridge and an image forming apparatus, which assure that the memory element in the process cartridge makes a desirable electrical connection with the main assembly of the image forming apparatus as the process cartridge is installed in an image forming apparatus.

Another object of the present invention is to provide a process cartridge and an image forming apparatus, which assure that the process cartridge is accurately positioned in the main assembly of the image forming apparatus, and also, the memory element in the process cartridge makes a desirable electrical connection with the main assembly of the image forming apparatus.

Another object of the present invention is to provide a process cartridge and an image forming apparatus, which are provided with a connector which comprises a memory element, and the connecting direction of which is the same as the inserting direction of the process cartridge.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

Hereinafter, the embodiments of the present invention will be described in detail with reference to the drawings.

In this embodiment, the "longitudinal direction" means a direction which is perpendicular to the installation or removal direction of a process cartridge, and also is parallel to the surface of a sheet of recording medium, and the "left or right direction" means the left or right direction as seen from above, and from the upstream side relative to the installation direction of a process cartridge.

In the description of the embodiments of the present invention given below, a laser beam printer is referred to as an example of an electrophotographic image forming apparatus. In this laser beam printer, a process cartridge is removably installable as will be described later.

Figure 1:
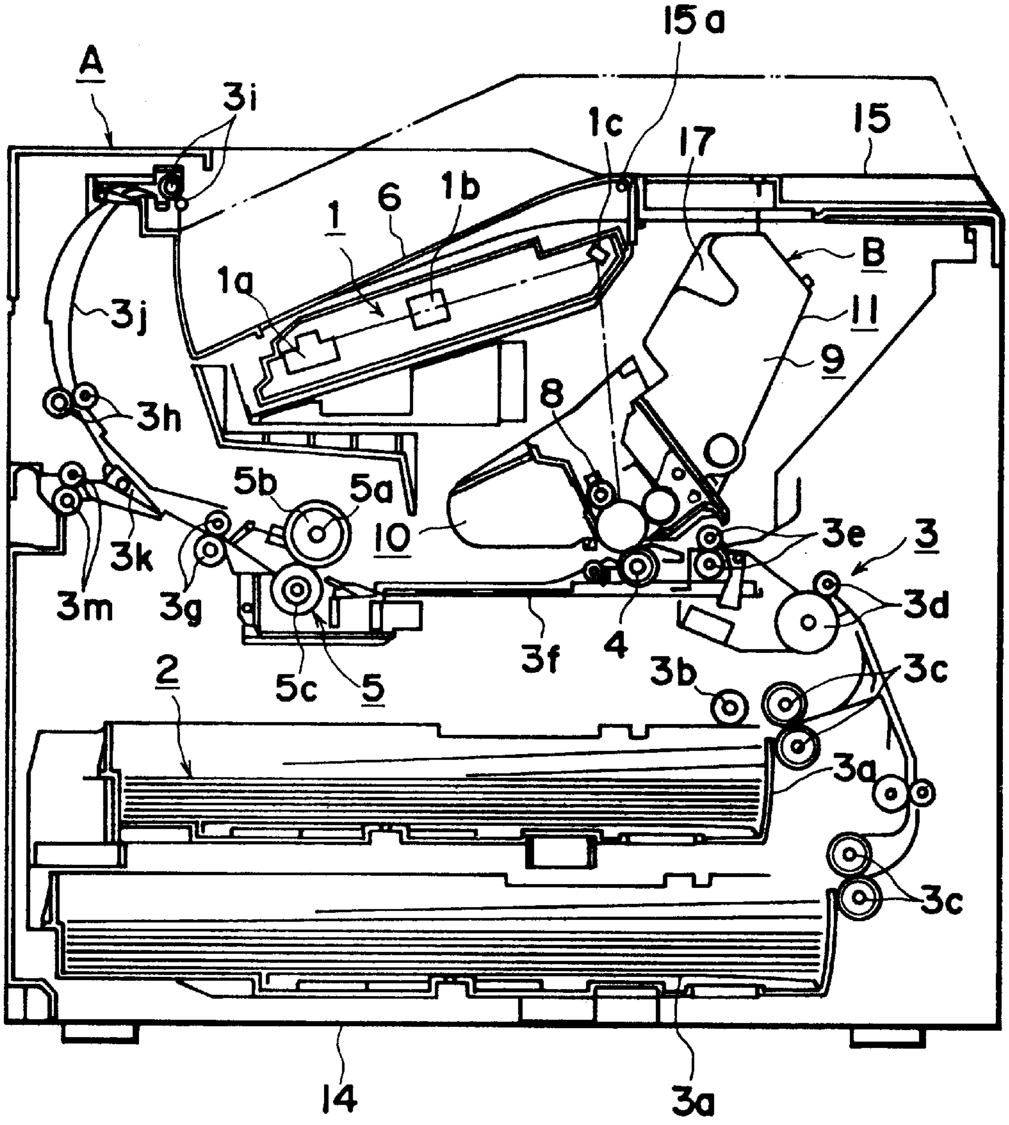
FIG. 1 is a vertical section of a laser beam printer.
Figure 2:
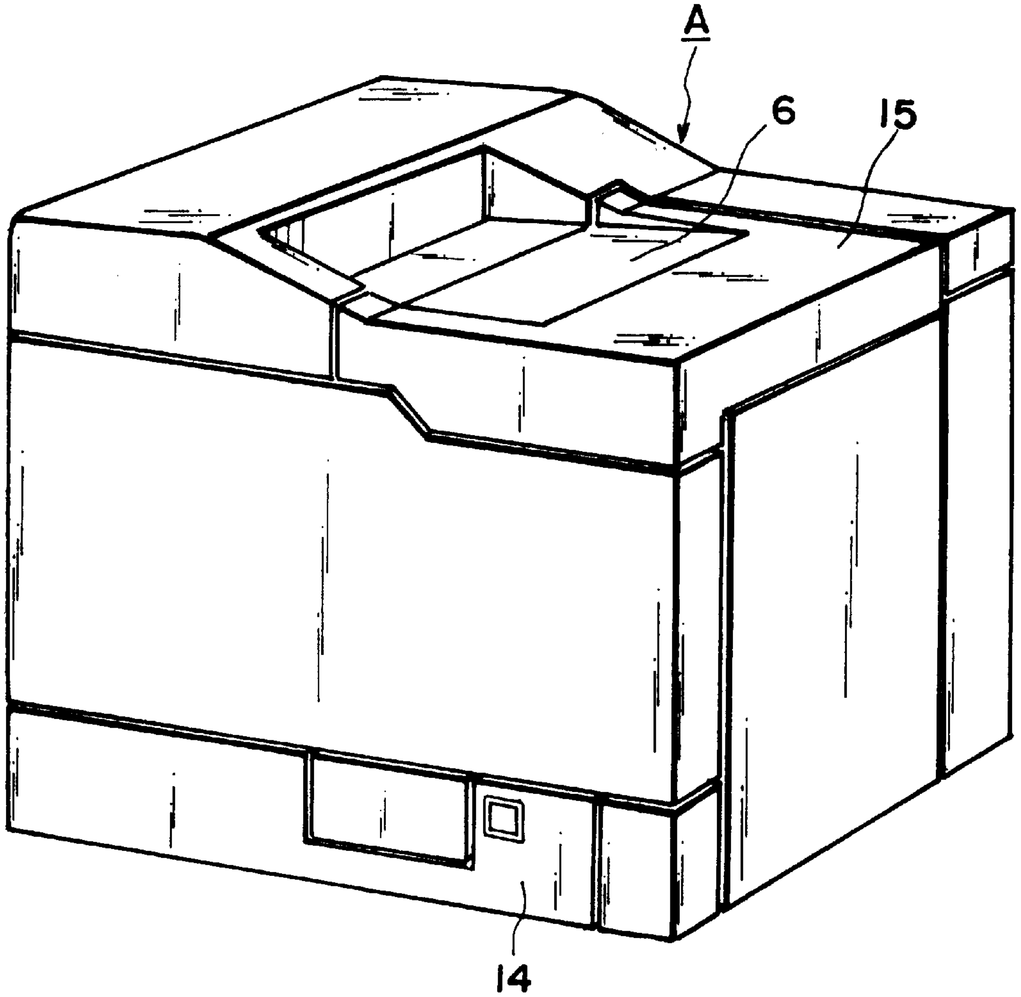
FIG. 2 is an external perspective view of the laser beam printer.
Figure 3:
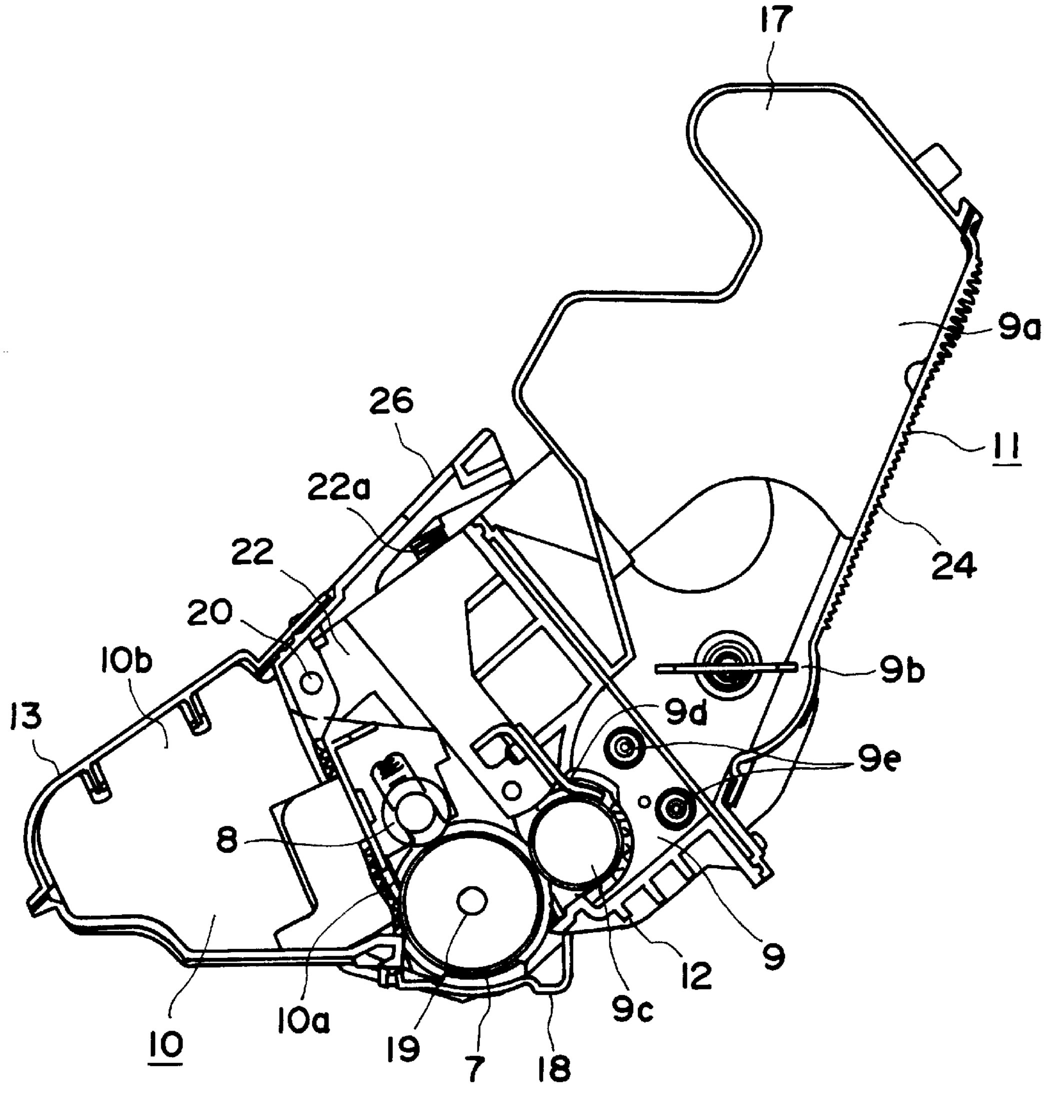
FIG. 3 is a vertical section of a process cartridge.
Figure 4:
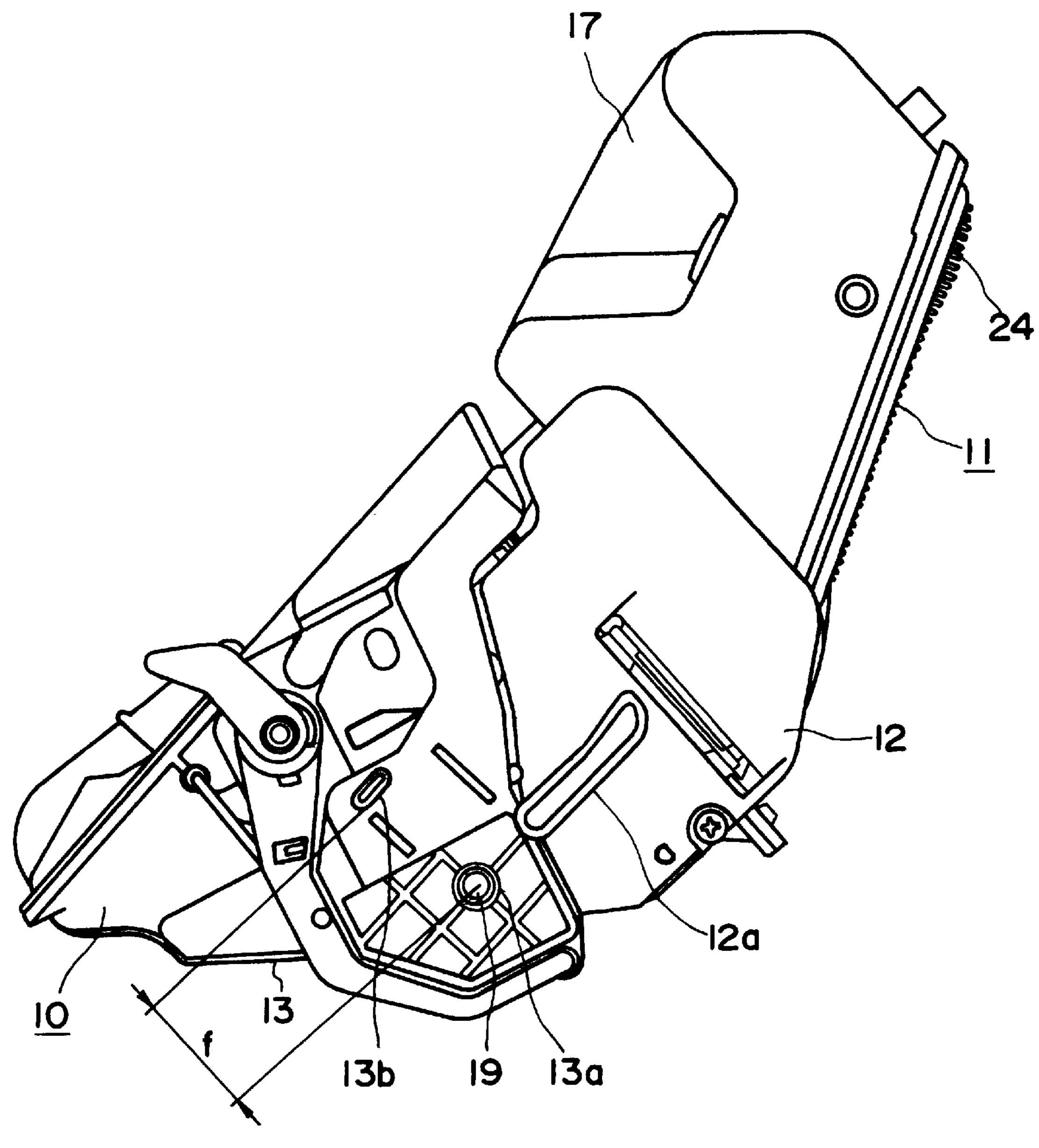
FIG. 4 is a side view of the process cartridge.
Figure 5:
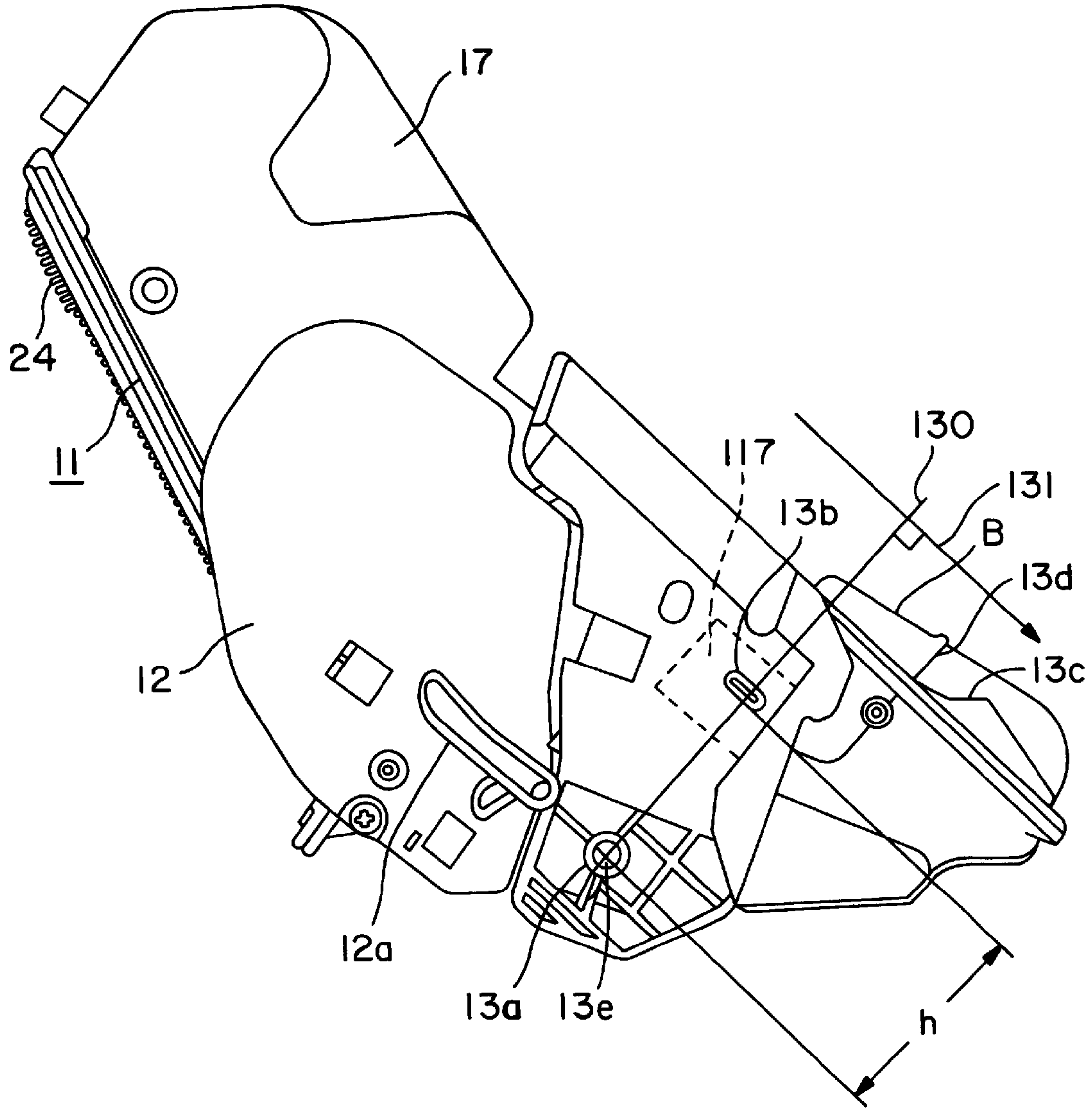
FIG. 5 is a side view of the process cartridge.
Figure 6:
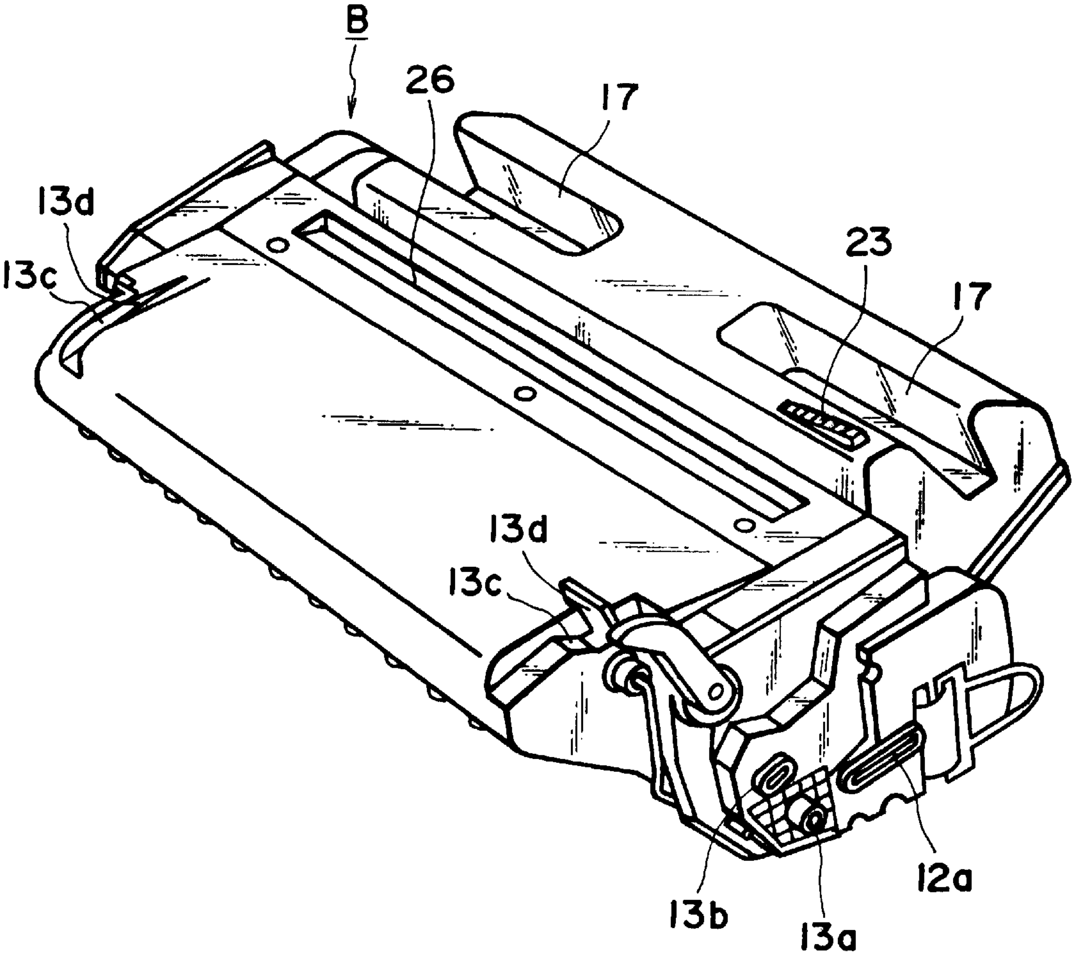
FIG. 6 is a perspective view of the process cartridge as seen from the top side.
Figure 7:
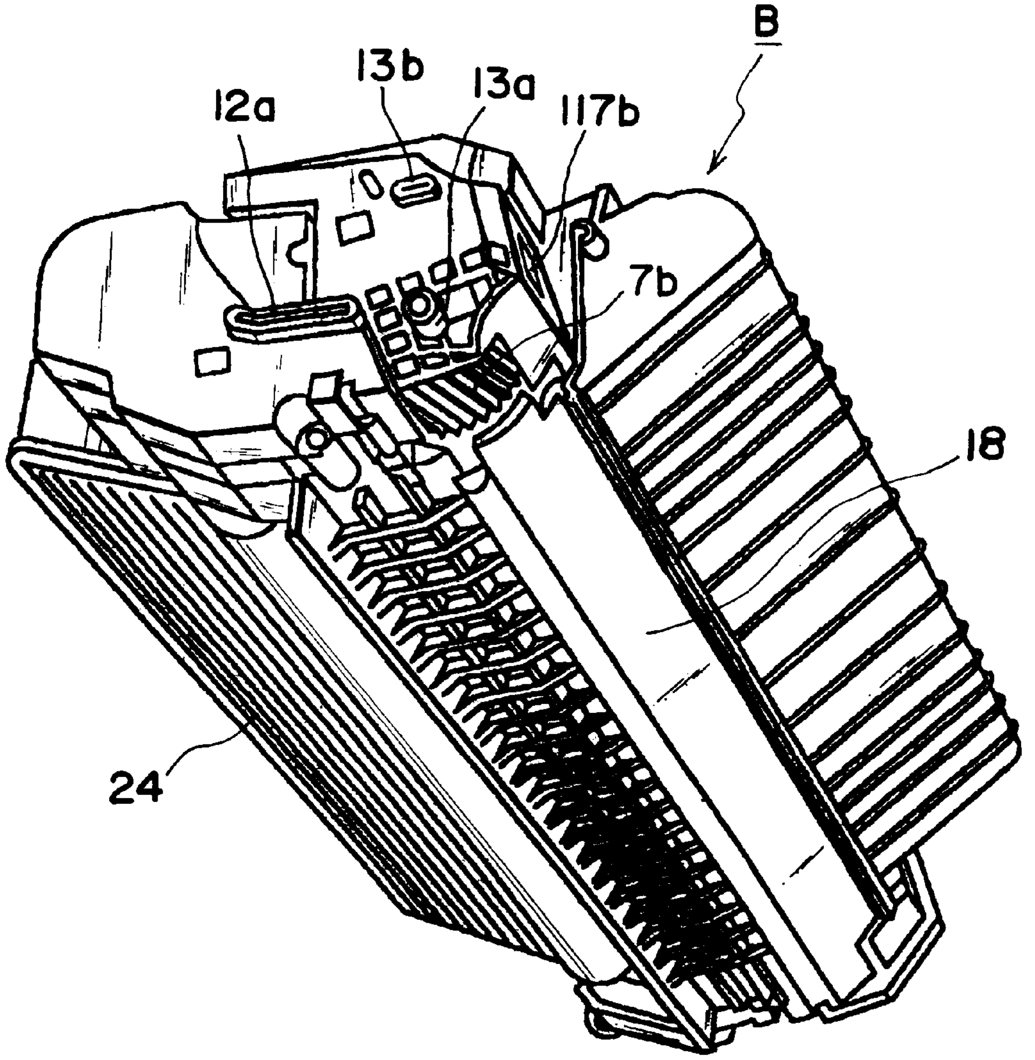
FIG. 7 is a perspective view of the process cartridge as seen from the bottom side.
Figure 8:
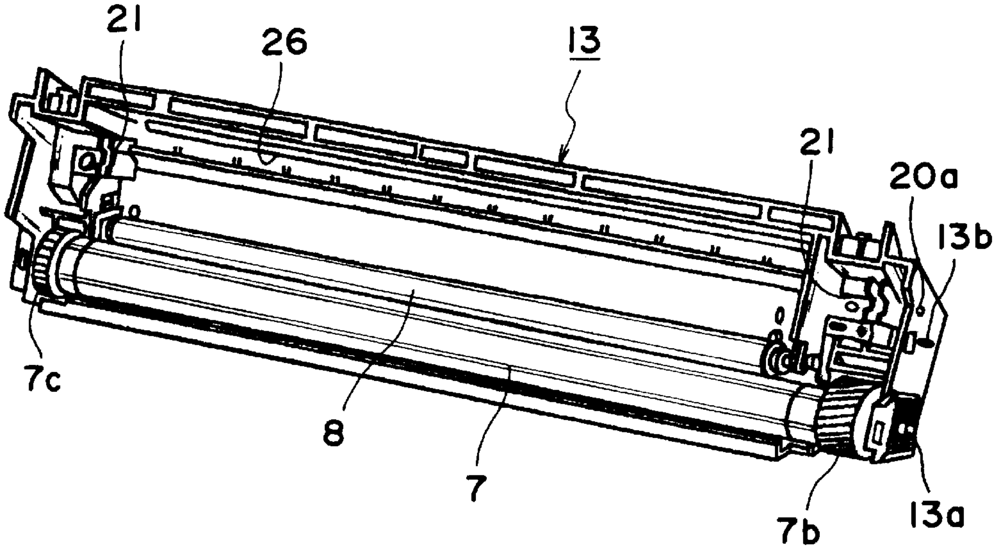
FIG. 8 is a perspective view of a cleaning unit.
Figure 9:
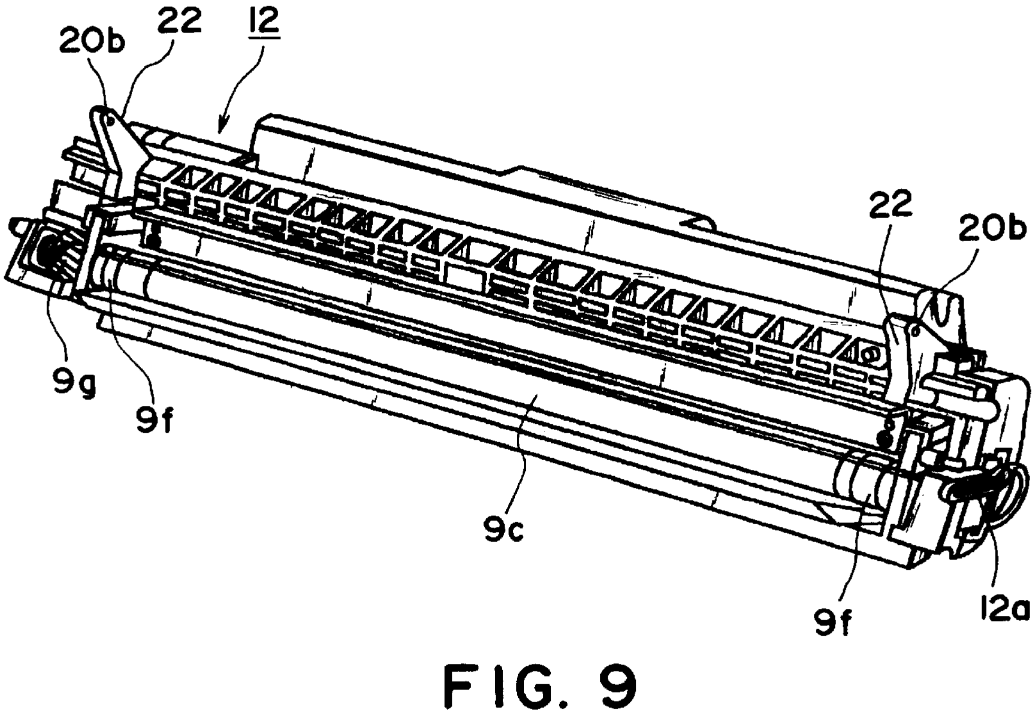
FIG. 9 is a perspective view of a developing unit.
Figure 10:
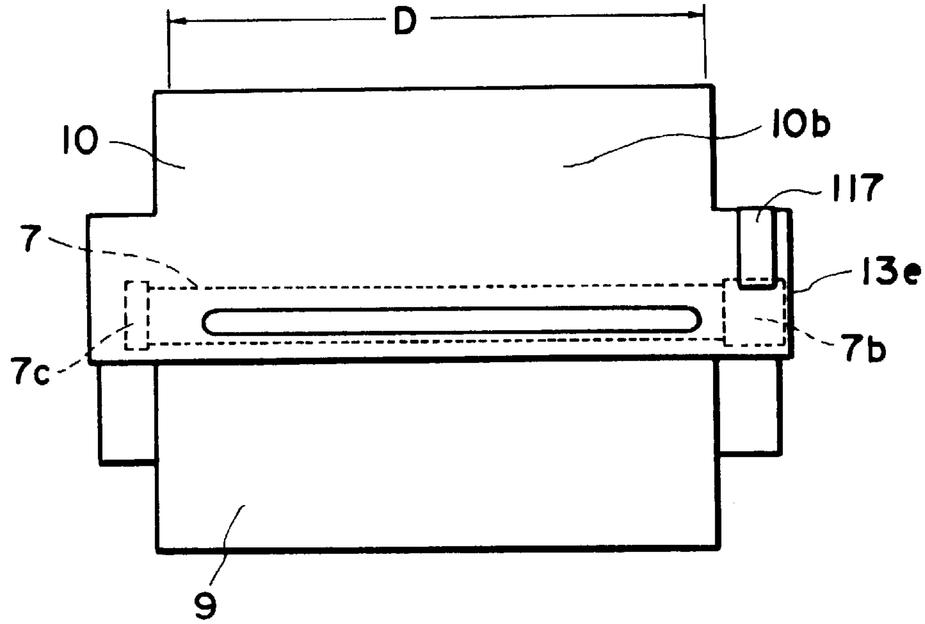
FIG. 10 is a schematic front view of a process cartridge, showing the positioning of a memory means.

First, referring to FIGS. 1–12, the process cartridge and the laser beam printer will be described. FIG. 1 is a schematic section of the laser beam printer, and illustrates the general structure of the printer. FIG. 2 is an external perspective view of the printer illustrated in FIG. 1. FIG. 3 is a schematic side view the process cartridge, and illustrates the general structure of the cartridge. FIG. 4 is the left side view of the process cartridge. FIG. 5 is the right side view of the process cartridge. FIGS. 6 and 7 are external perspective views of the process cartridge. FIGS. 8 and 9 are external perspective views of a cleaning unit and a development unit, respectively. FIG. 10 is a schematic front view of the process cartridge.

As for the order of the description, the general structures of the laser beam printer and the process cartridge will be described first, and then, the photosensitive drum in the process cartridge, and the adjacencies thereof will be described.

(General Structure)

Referring to FIG. 1, this laser beam printer A comprises an optical means 1, and a photosensitive drum 7 as an electrophotographic photosensitive member. The optical means 1 comprises a laser as a light source, a polygon mirror 1*a*, a lens 1*b*, and a deflection mirror 1*c*. In operation, the light beam modulated with imaging data is projected from the laser, is moved in a scanning manner by the polygon mirror 1*a*, is passed through the lens 1*b*, is deflected by the mirror 1*c*, and scans the surface of the photosensitive drum 7 to form a toner image.

In synchronism with the formation of a toner image, a recording medium 2, such as a sheet of transfer paper, is delivered from a cassette 3*a* to the transfer station in the printer by a pickup roller 3*b*, conveyer roller pairs 3*c* and 3*d*, a registration roller 3*e*, and the like. During the delivery, the recording medium 2 is turned over. At the transfer station, the toner image formed on the peripheral surface of the photosensitive drum 7 in the image forming station in a process cartridge B is transferred onto the recording medium 2 by applying voltage to a transfer roller 4 as a transferring means. After the toner image transfer, the recording medium 2 is guided by a guide member 3*f* to a fixing means 5 constituted of a fixer roller 5*b* and a driver roller 5*c*. The fixer roller 5*b* contains a heater 5*a*, and the driver roller 5*c* conveys the recording medium 2 while pressing the recording medium 2 against the fixer roller 5*b*. As the recording medium 2 is passed through the fixing means, between the fixer roller 5*b* and the driver roller 5*c*, the toner image, which has simply been transferred onto, or deposited on, the recording medium 2, is permanently fixed to the recording medium 2. Thereafter, the recording medium 2 is further conveyed by discharge roller pairs 3*g*, 3*h*, and 3*i*, through a sheet turning path 3*j*, to a discharge station, from which the recording medium 2 is discharged. Regarding the discharging of the recording medium 2 from an image forming apparatus, the switchable flapper 3*k* may be activated so that the recording medium 2 is directly discharged by a discharge roller pair 3*m*, without being put through the sheet turning path 3*j*.

Referring to FIG. 3, in the process cartridge B comprising the aforementioned image forming section, the photosensitive drum 7 with a photosensitive layer is rotated, and the peripheral surface of the photosensitive drum 7 is uniformly charged by applying voltage to a charge roller 8, that is, the charging means. Then, the charged surface of the photosensitive drum 7 is exposed to an optical image projected through an exposure opening 26 from the aforementioned optical means 1, whereby a latent image is formed on the peripheral surface of the photosensitive drum 7. This latent image is developed by a developing means 9 constituted of a developing apparatus.

In the developing means 9, the toner within a toner storing chamber 9*a* is fed by a toner feeding member 9*b* toward a development roller 9*c* which contains a stationary magnet, and is being rotated. As the toner is fed toward the development roller 9*c*, the toner is stirred, being triboelectrically charged further by a stirring member 9*c*, and then, is coated on the peripheral surface of the development roller 9*c* by a development blade 9*d*, forming a toner layer. Then, the toner in the toner layer is transferred onto the photosensitive drum 7, in correspondence to the latent image on the photosensitive drum 7. As a result, the latent image is developed into a toner image.

Next, the toner image is transferred onto the recording medium 2 by applying to the transfer roller 4 voltage with the polarity which is opposite to that of the toner image. Thereafter, the residual toner on the photosensitive drum 7 is removed by a cleaning means 10; the toner which is remaining on the photosensitive drum 7 after the toner image transfer is scraped off by a cleaning blade 10*a*, and collected in a waste toner collector 10*b*.

The cartridge B comprises a cartridge frame and the various components such as the photosensitive drum 7 are assembled into the cartridge frame. As for the cartridge frame, it is formed by putting together a toner container 11 and a development frame 12, and then joining them with a cleaning frame 13.

(Housing Structure)

The process cartridge B comprises a housing formed by joining the toner container 11, the development frame 12, and the cleaning frame 13 as described above, and the structure of this housing will be described next.

Referring to FIG. 3, the toner container 11 has the toner storing chamber 9*a* and the toner feeding member 9*b*. To the development frame 12, the development roller 9*c* and the development blade 9*d* are attached. Also to the development frame 12, the stirring member 9*e* is rotatively attached, adjacent to the development roller 9*c*, to circulate the toner within the development chamber. The toner container 13. and the development frame 12 are welded together to form a development unit.

To the cleaning frame 13, the photosensitive drum 7, the charge roller 8, and the cleaning means 10 are attached. Also to the cleaning frame 13, a drum shutter assembly 18, which covers the photosensitive drum 7 to protect the photosensitive drum 7 when the process cartridge B is out of the main assembly 14 of an image forming apparatus, is attached. The cleaning frame 13 inclusive of the aforementioned drum, rollers, and means, and the drum shutter assembly 14, constitute a cleaning unit.

The development unit and the cleaning unit are connected with the use of a pivot 20, completing the process cartridge B. More specifically, the development frame 12 is inserted into the opening of the cleaning frame 13, being aligned with each other so that a hole 20*b* located at the end portion of the arm 22 of the development frame 12, and a hole 20*a* of the cleaning frame 13, are aligned, and the pivot 20 is extended through these holes 20*a* and 20*b* in the longitudinal direction of the process cartridge B. Between the portion of the cleaning frame 13, which extends over the top surface of the development frame 12, and the top surface of the development frame 12, a compression spring 22*a* is disposed in a compressed state, so that a spacer ring 9*f*, which is slightly larger in diameter than the development roller 9*c*, is pressed against the peripheral surface of the photosensitive drum 7 to maintain a development gap of approximately 300 μm between the photosensitive drum 7 and the development roller 9*c*.

(Guiding Means Structure)

FIGS. 4 and 5 are views of the left and right lateral walls of the process cartridge, respectively.

The external surface of each of the left and right lateral walls of the housing of the aforementioned cartridge frame is provided with a guiding means which plays a role of a guide when the process cartridge B is installed into, or removed from, the main assembly 14 of an image forming apparatus. This guiding means is constituted of a dowel 13*a* as the first guide member, a long guide 12*a* as the third guide member, and a short guide 13*b* as the second guide member.

The dowel 13*a* is a cylindrical member, and nonrotatively supports a drum shaft 19 which supports the photosensitive drum 7. The dowel 13*a* is concentric with the drum shaft 19, and is located on the external surface of each of the left and right lateral walls of the cleaning frame 13. The long guide 12*a* is located on the external surface of the left and right lateral walls of the development frame 12, and extends over the external surface of the cleaning frame 13, which is practically continuous with the external surface of the development frame 12. The short guide 13*b* is also located on the external surface of each of the left and right lateral walls of the cleaning frame 13, being above the dowel 13*a* and in alignment with the dowel 13*a* in the direction indicated by a line 130 which is perpendicular to the direction 131 in which the process cartridge B is installed. The distances between the short guide 13*b* and the dowel 13*a*, on the left and right sides, are f and h, respectively. The dowel 13*a* and the short guide 13*b* are disposed at approximately equivalent locations in terms of the direction in which the process cartridge B is inserted into, or removed from, the main assembly 14. The dowel 13*a* and the long guide 12*a* are aligned in the direction of the cartridge insertion or removal.

The long guide 12*a* extends in the direction of the cartridge insertion, and is slanted at such an angle that is substantially the same as the angle at which the process cartridge is inserted. The dowel 13*a* is located on the imaginary line extended in the cartridge insertion direction from the long guide 12*a*. The short guide 13*b* is disposed substantially in parallel to the long guide 12*a*.

(Means for Process Cartridge Installation)

Figure 12:
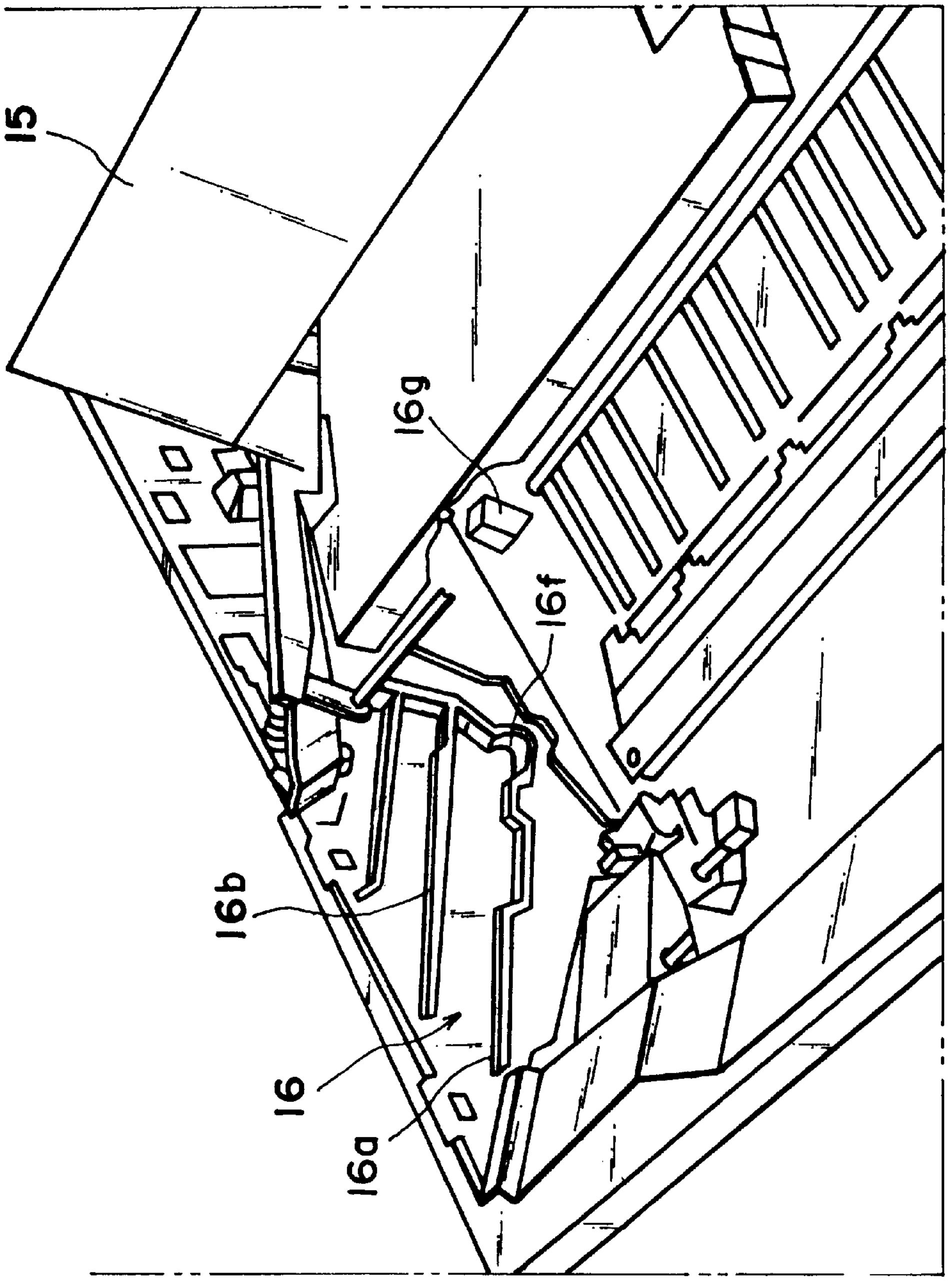
FIG. 12 is a perspective view of the space in which a process cartridge is installed.
Figure 13:
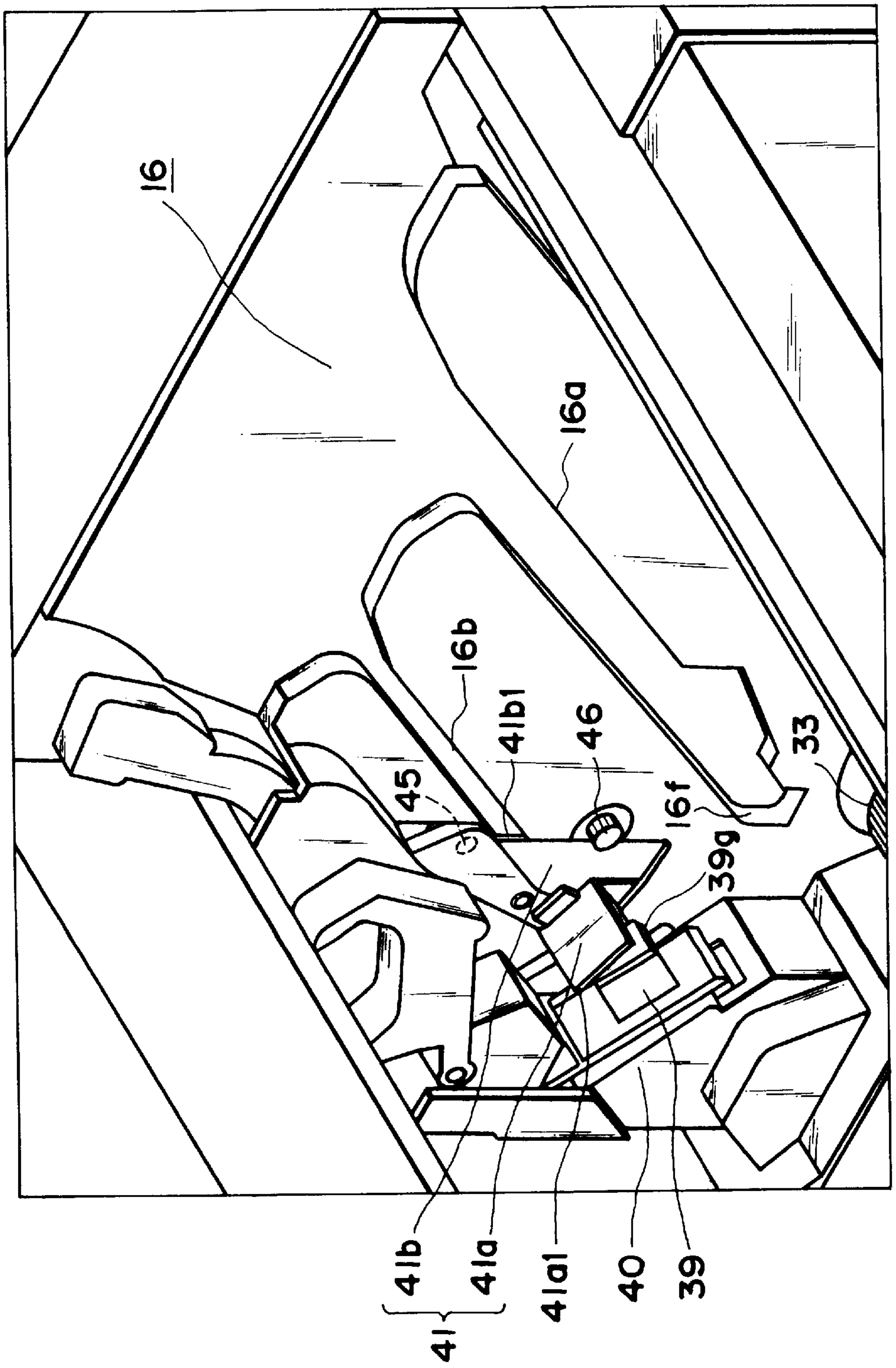
FIG. 13 is a perspective view of the space in which a process cartridge is installed.

Referring to FIG. 1, as a lid 15 is rotatively opened about a pivot 15*a* in the counterclockwise direction, a cartridge installation space is exposed as illustrated in FIGS. 12 and 13. Each of the left and right lateral walls of the cartridge installation space, that is, each of the internal surfaces of the left and right lateral walls of the main assembly 14, is provided with a cartridge installation guide 16, which is provided with two pieces of guide portions 16*a* and 16*b* which are positioned in correspondence with the dowel 13*a*, the long guide 12*a*, and the short guide 13*b*, which are illustrated in FIGS. 4, 5, 6 and 7, to guide them. Next, referring to FIGS. 14–20, as the process cartridge B is inserted along the guide portions 16*a* and 16*b*, the dowel 13*a* engages with a positioning portion 16*f*, and at the same time, a recessed portion 13*c* (FIG. 6) formed at each of the substantially top front edges between the top surface of the cleaning frame 13 and the left and right lateral walls of the cleaning frame 13 to regulate the rotation of the process cartridge B engages with the rotation regulating portion provided on the main assembly side, below the optical means 1. Then, the lid 15 is closed to finish the installation of the process cartridge B into the correct location in a laser beam printer A.

As the process cartridge B is positioned in the main assembly 14, a drum gear 7*b* attached to one end of the photosensitive drum 7 by pressing, crimping, or the like means engages with a driving gear 33 (FIG. 13) on the main assembly 14 side, and a gear 7*c* attached on the other side of the photosensitive drum 7 engages with an unillustrated gear fixed to the axle of the transfer roller 4. The drum gear 7*b* of the photosensitive drum 7 is also engages with the sleeve gear (helical gear) 9*g* of the development roller 9*c*.

Therefore, the rotationally driving force of the driver gear 33 on the main assembly 14 side is transmitted to the drum gear 7*b*, rotating the photosensitive drum 7, and then is transmitted to the development roller gear 9*g* through the drum gear 7*b*, rotating the development roller 9*c*. The same rotational driving force is transmitted to the gear of the transfer roller 4 through the gear 7*c* of the photosensitive drum 7, rotating the transfer roller 4.

Referring to FIGS. 3–6, the process cartridge B is provided with a handhold portion 17 and ribs 23 and 24 so that the process cartridge B can be easily held when the process cartridge B is installed or removed. The process cartridge B is also provided with a drum shutter 18 (FIG. 3), which is opened as he process cartridge B is installed into the image forming apparatus A, and is closed as the process cartridge B is removed from the image forming apparatus A, so that the photosensitive drum 7 is protected when the process cartridge B is out of the image forming apparatus A.

(Memory Means Structure on Process Cartridge Side)

Figure 11:
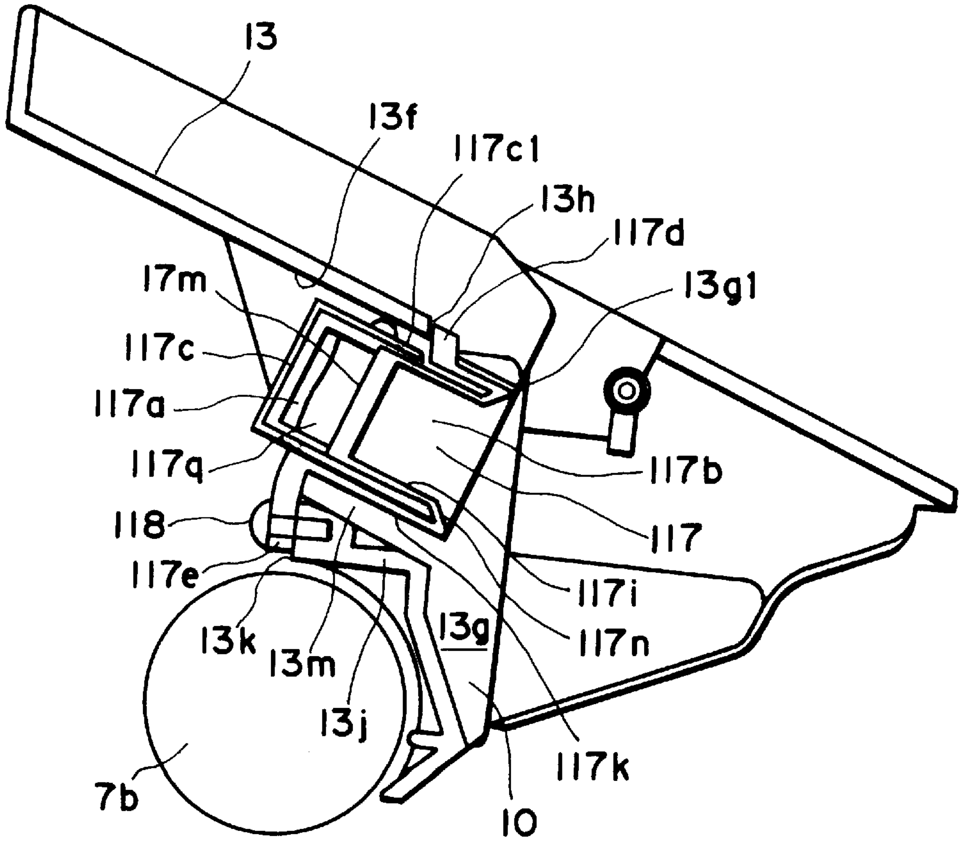
FIG. 11 is a vertical section of the memory means.
Figure 26:
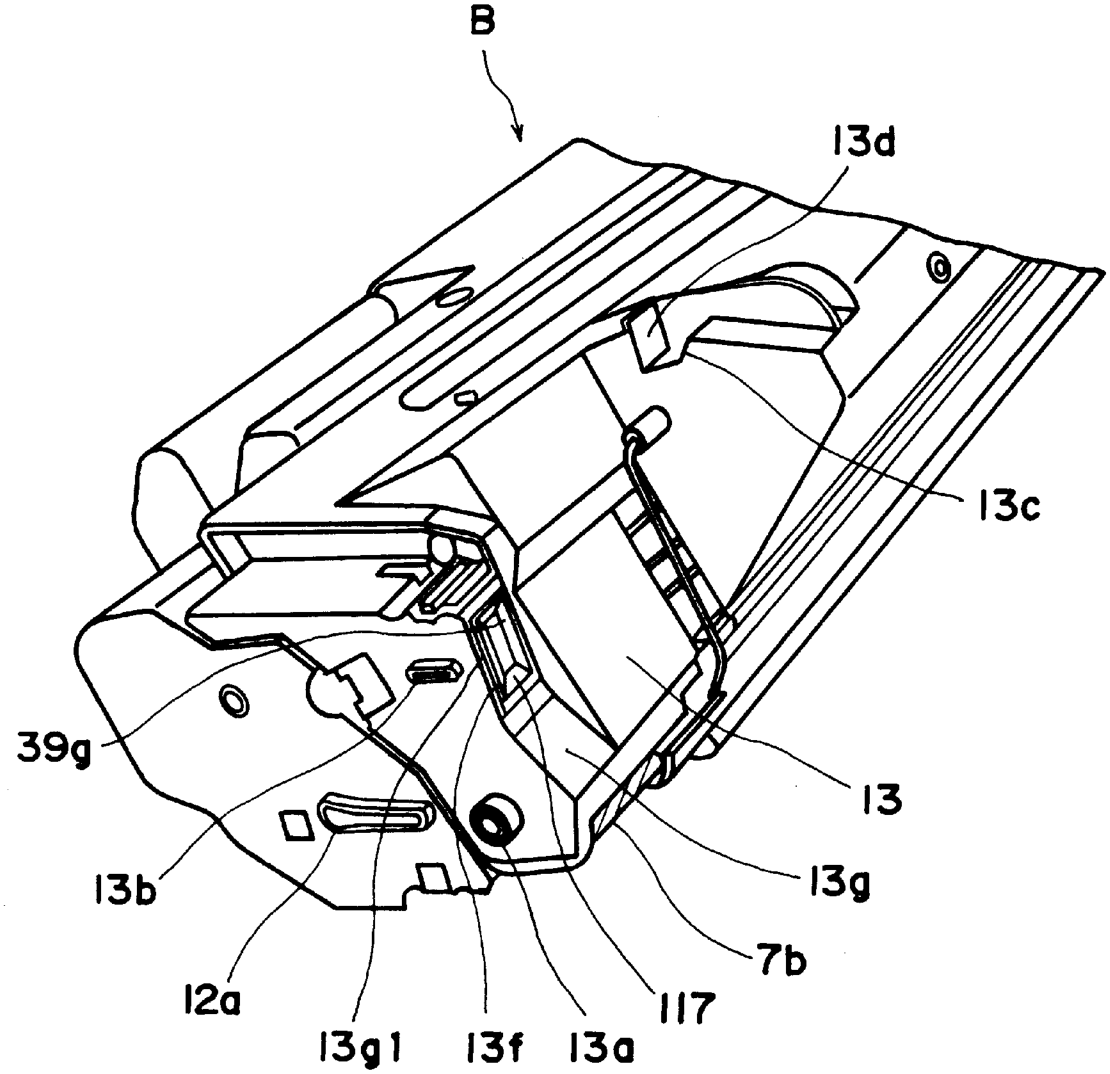
FIG. 26 is a perspective view of a process cartridge as seen from the right front side.
Figure 27:
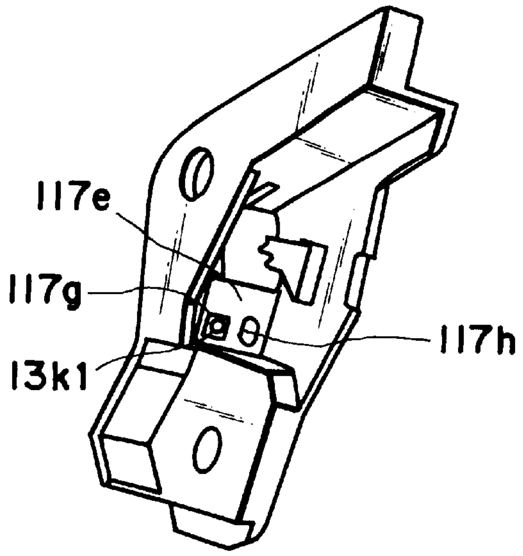
FIG. 27 is a perspective view of the interior of the right front corner of the process cartridge, as seen from the direction opposite to the direction in which the process cartridge is viewed in FIG. 26.
Figure 28:
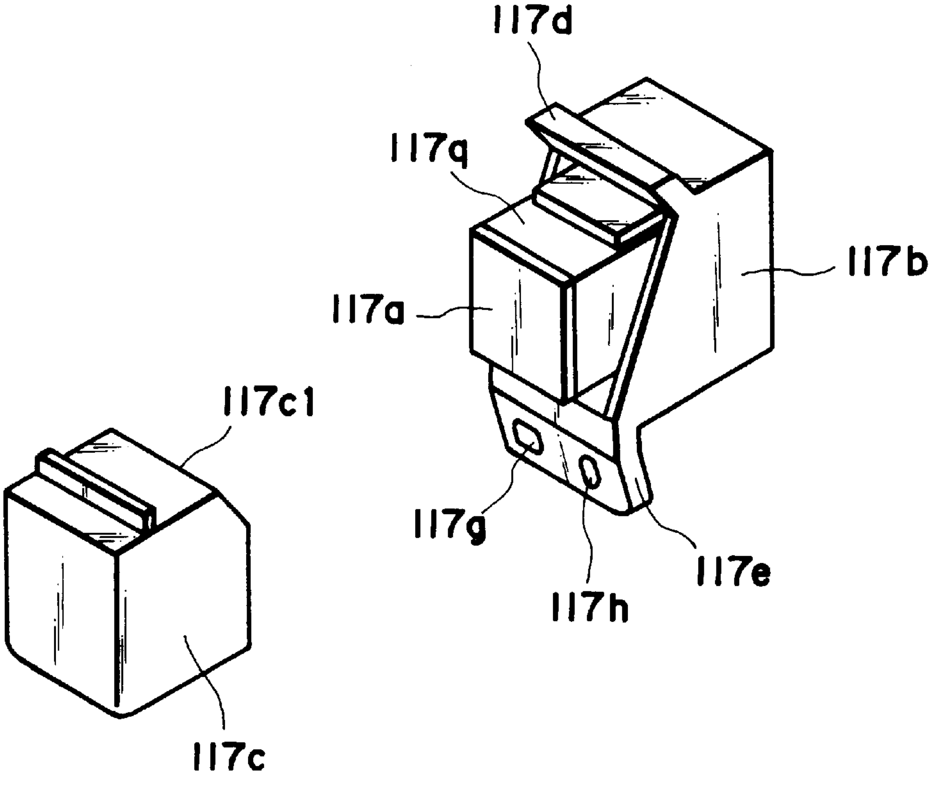
FIG. 28 is a perspective view of disconnected connectors.

Next, the memory means on the process cartridge side will be described. FIGS. 10 and 26 are drawings that show the location of the memory means 117. FIG. 27 is a perspective view of a part of the interior of the cleaning frame 13, and show how the memory means 117 is attached to the cleaning frame 13. FIG. 28 is a perspective view of disconnected connectors, and shows how the memory means 117 is mounted. More specifically, referring to FIG. 11, the memory means 117 comprises a memory chip such as an RAM or ROM as illustrated in FIG. 11, and is used for such purposes as storing in advance the information necessary for image formation, exchanging information between the process cartridge B and the main assembly 14 to provide the main assembly with the history or condition of the process cartridge B when the process cartridge B is installed into the main assembly 14, or the like purposes. The memory means 117 also comprises a chip mount 117*q* where the memory chip 117*a* is mounted, a connector portion 117*b*, flange portions 117*d* and 117*e* by which the memory means 117 is attached to the cleaning frame 13, and the like, in addition to the memory chip 117*a* such as a RAM or ROM. The opening edge of the square hole of the connector portion 117*b*, into which an interface connector 39 is plugged, is chamfered.

Referring to FIG. 10 which is drawn to show the positional relationship among the process cartridge components, the memory means 117 is attached to the cleaning frame 13, at a location equivalent to the location of the gear portion of the drum gear 7*b* in terms of the longitudinal direction of the process cartridge B. This positioning of the memory means 117 places the memory means 117 outside the sheet path D in terms of the longitudinal direction of the process cartridge B; In other words, this positional arrangement is made to place the memory means 117 in the cleaning means 10 without sacrificing the space for storing the waste toner. Since this location is close to a positional reference 13*e* in terms of the longitudinal direction, the positional accuracy for the memory means 117 in the longitudinal direction is improved. This reference 13*e* in the longitudinal direction constitutes the dimensional reference for cartridge production, as well as the reference for the positioning of the process cartridge relative to the main assembly 14 in terms of the longitudinal direction. More specifically, when the process cartridge B is installed into the cartridge space of the main assembly 14, the right or left installation guide member 16 comes in contact with the reference 13*e* so that the process cartridge B is precisely positioned in the main assembly in terms of the longitudinal direction. The direction in which the connector portion 117*b* illustrated in FIGS. 5 and 10 is engaged is rendered approximately the same as the direction in which the process cartridge B is inserted as illustrated in FIG. 5, so that the connector portion 117*b* is not crookedly connected. In other words, the direction in which the connector is engaged is substantially in parallel to the direction of the alignment between the dowel 13*a* and the long guide 12*a*, which also is substantially in parallel to the direction of process cartridge insertion. Further, the connector portion 117*b* is located on the line 130 drawn in FIG. 5, which is perpendicular to the direction 131 in which the process cartridge is inserted, and runs through the center (dowel 13*a* of the cleaning frame 13) of the process cartridge B. Therefore, the angular oscillation of the process cartridge B after installation can be minimized.

Figure 22:
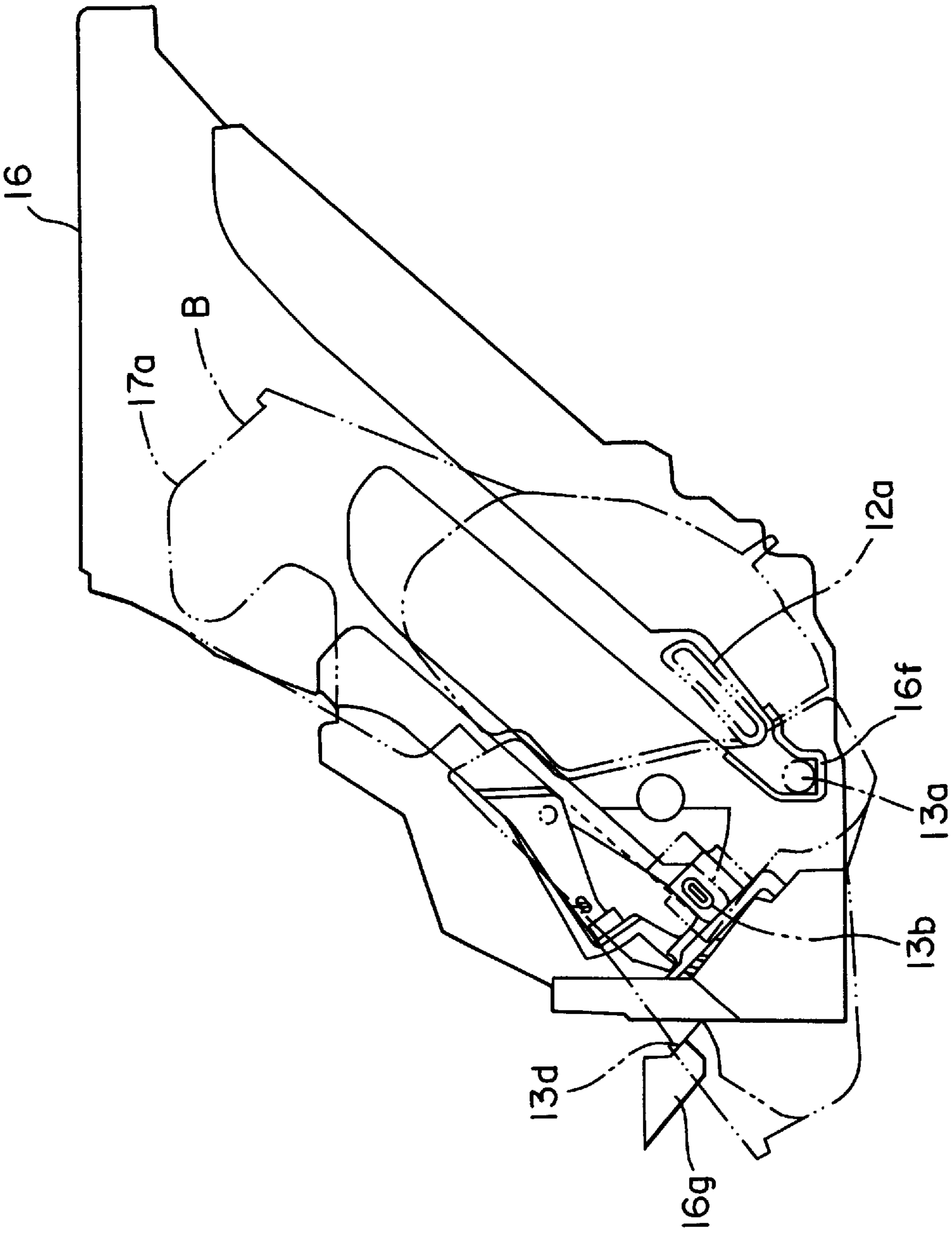
FIG. 22 is a side view of a process cartridge, which depicts one of the stages of cartridge removal.

Referring to FIG. 22, when the process cartridge B is removed from the main assembly 14, the dowel 13*a* comes out of the positioning portion 16*f* by rotating about the contact point between a removal contact portion 13*d* and the rotation regulating portion 16*g*; in other words, the center of the process cartridge B (dowel 13*a* of the cleaning frame 13) is released from the positioning portion 16*f*. since this removal contact portion 13*d* constitutes a fulcrum for cartridge removal, and the connector portion 117*b* is located between the removal contact portion 13*d* and the center of the process cartridge 5 (dowel 13*a* of the cleaning frame 13), the angular oscillation of the connector portion 117*b* is minimized at the time of removal as well as at the time of installation.

As for the assembly of the memory means 117 into the cleaning frame 13, first, the flange portion 117*d* is put through the through hole 13*f* of the cleaning frame 13, and then, the flange portion 117*e* is fixed to the cleaning frame 13 with the use of a small screw or the like.

Adjacent to the memory means 117, the charge roller 8 and the electrodes of the charge roller 8 are located. and therefore, the memory means 117 is provided with a cap 117*c* which covers the memory chip 117*a* as a counter measure for electrical leakage or the like.

Next, the structure and location of the memory means 117 will be described. Referring to FIG. 26, a space 13*g* in the form of a triangular column which extends in the longitudinal direction is formed at the right front corner of the cleaning frame 13, relative to the direction of process cartridge insertion, and a square through hole 13*f*, which extends rearward, in parallel to the direction of process cartridge insertion, is cut through the forwardly facing vertical walls of this space 13*g*, that is, the forwardly facing vertical walls of the cleaning frame 13. The memory means 117 is put through this through hole 13*f* from inside, and then, fixed to the cleaning frame 13.

Referring to FIG. 28, the memory means 117 is provided with the flange 117*d*, which extends along the top edge of the connector portion 117*b*, and is used to attach the memory means 117 to the cleaning frame 13. This flange portion 117*d* is slanted backward as seen from inside the through hole 13*f* (as seen from the left side of FIG. 11), and is inserted in the hole 13*h* cut through the top wall of the through hole 13*f* to be used to attach the memory means 117 to the cleaning frame 13. The connector portion 117*b* is also provided with the flange 117*e* which is also used for attaching the memory means 117 to the cleaning frame 13. Referring to FIGS. 11, 27, and 28, the flange portion 117*e* is provided with a square hole 117*g* and a vertically elongated round hole 117*h*. In the square hole 117*g*, a dowel 13*kl* of a memory means mount 13*k* provided on the cleaning frame 13, more specifically, on the wall 13*j* which isolates the memory means 117 from the photosensitive drum 7, is fitted, and the elongated round hole 117*h* is for a small screw 118 which is screwed into unillustrated female threads provided in the memory means mount 13*k*.

Referring again to FIG. 11, the connector portion 117*b* has a double wall, that is, the inner and outer walls 117*i* and 117*k* as shown in FIG. 11. Between the inner wall 117*i* and the outer wall 117*k*, there is a gap in which the wall of a cap 117*c* fits. The external surface of the bottom wall 117*m* (rear wall relative to the direction of process cartridge insertion) of the connector portion 117*b* is provided with a memory chip mount 117*q*, to which a memory chip 117*a* is fixed. The memory chip 117*a* is electrically connected to unillustrated contacts provided on the connector portion 117*b*. The cap 117*c* is in the form of a box, the cross section of which is substantially square, and the top front corner 117*cl* of which is chamfered as illustrated in FIG. 28 so that it does not make contact with the flange 117*d*. In other words, the top corner 117*cl* of the cap 117*c* does not enter the gap between the inner and outer walls of the connector portion 117*b*. Also referring to FIG. 11, between the bottom wall of the through hole 13*f* and the outer wall 117*k* of the connector portion 117*b*, a gap 13*m* is provided which is greater than the height of the flange portion 117*e*.

When mounting the memory means 117, first, the memory means 117 is inserted into the through hole 13*f* from the inward side of the through hole 13*f*, so that the contact side, or engaging side, faces forward, and so that the outer wall 117*k* makes contact with the isolation wall 13*j*. Then, the flange portion 117*d* is fitted into the hole 13*h* by shifting upward the memory means 117, and the flange portion 117*e* is placed in contact with the memory means mount 13*k*, with the dowel 13*kl* of the memory means mount 13*k* being fitted in the square hole 117*g* of the flange portion 117*e*. Thereafter, the small screw 118 is put through the screw hole 117*h* and is screwed into the unillustrated female threads of the memory mount 13*k*. As for the removal of the memory means 117, the above described steps for installing the memory means 117 is carried out in reverse.

(Interfacial Structure on Image Forming Apparatus Side)

Next, the interfacial structure between the memory means of the process cartridge B and the main assembly 14, in particular, on the main assembly side, will be described.

Figure 21:
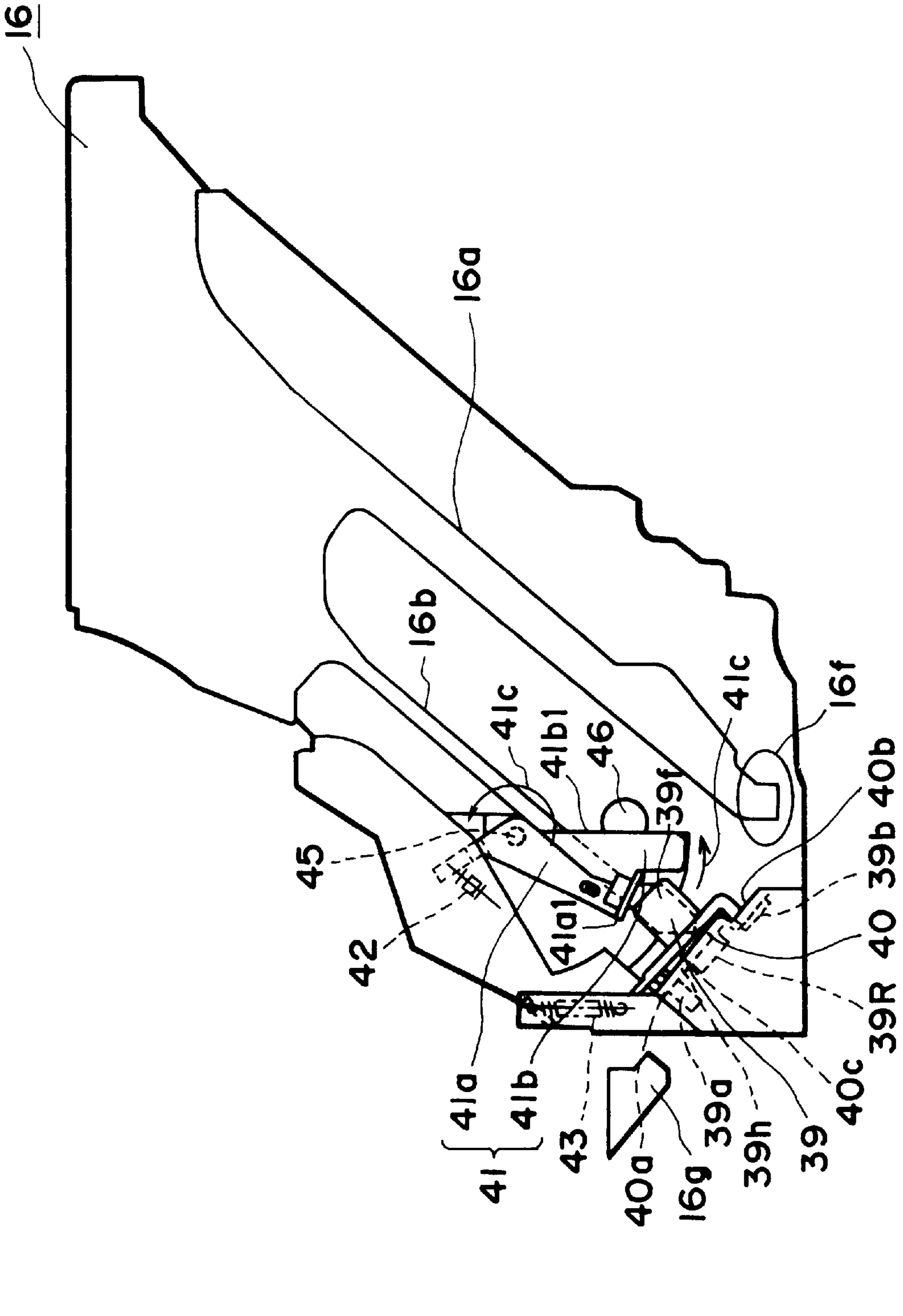
FIG. 21 is a side view of a process cartridge, which depicts one of the stages of cartridge installation.

Referring to FIGS. 12 and 21, a referential FIG. 39 designates a connector on the main assembly side, which is connectable with the connector portion 117*b* of the process cartridge B. The connector 39 is held by the connector supporting means 40, or the connector supporting wall of the cleaning frame 13, on the main assembly side, affording a predetermined amount of play for the connector 39, whereas the connector supporting means 40 on the main assembly 14 is immobile. In spite of the play, the connector 39 remains at the topmost position since it is held by the upward elastic force by a tensile coil spring 43.

Figure 24:
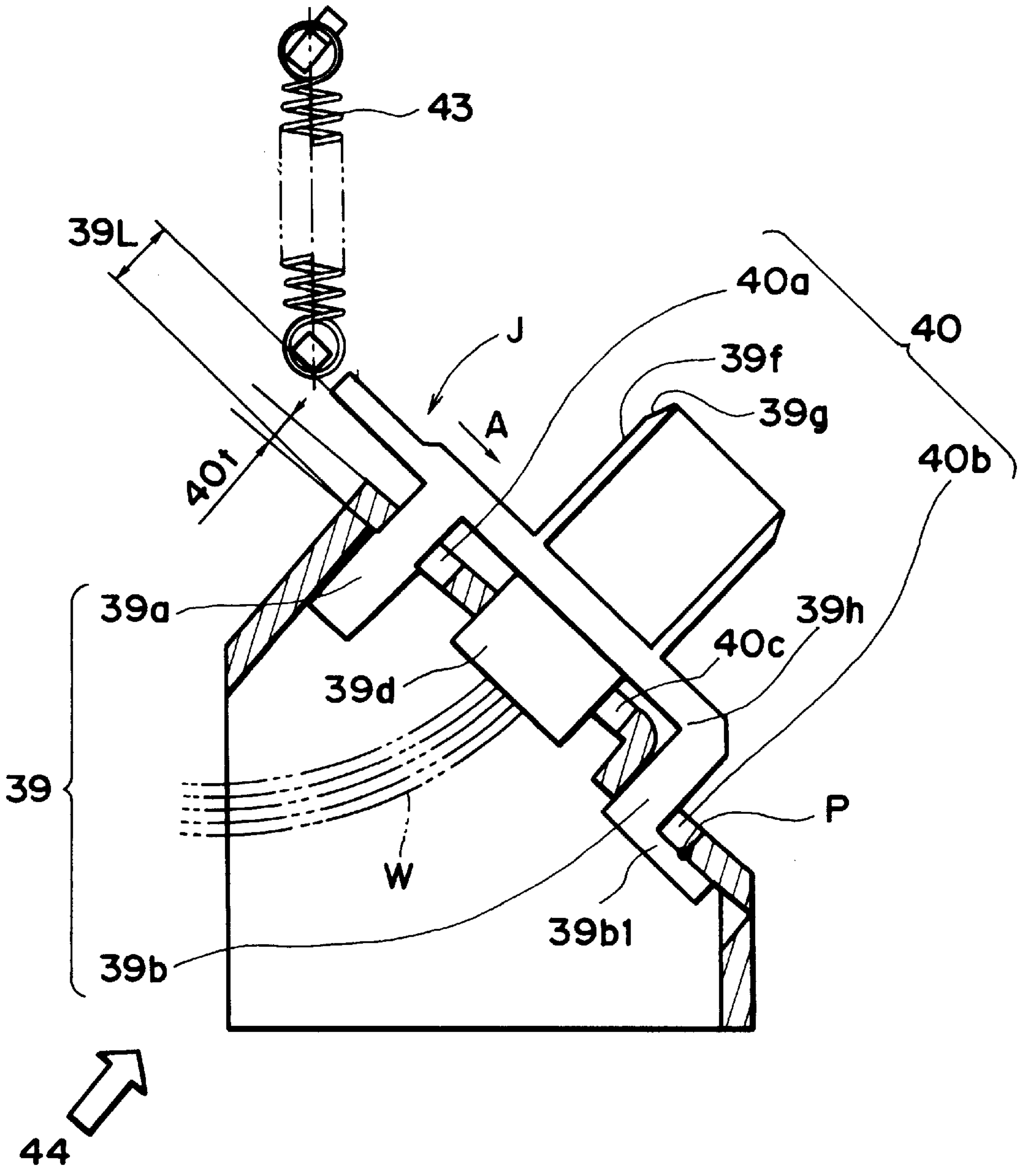
FIG. 24 is a vertical section of the connector on the side of the main assembly of an image forming apparatus.
Figure 25:
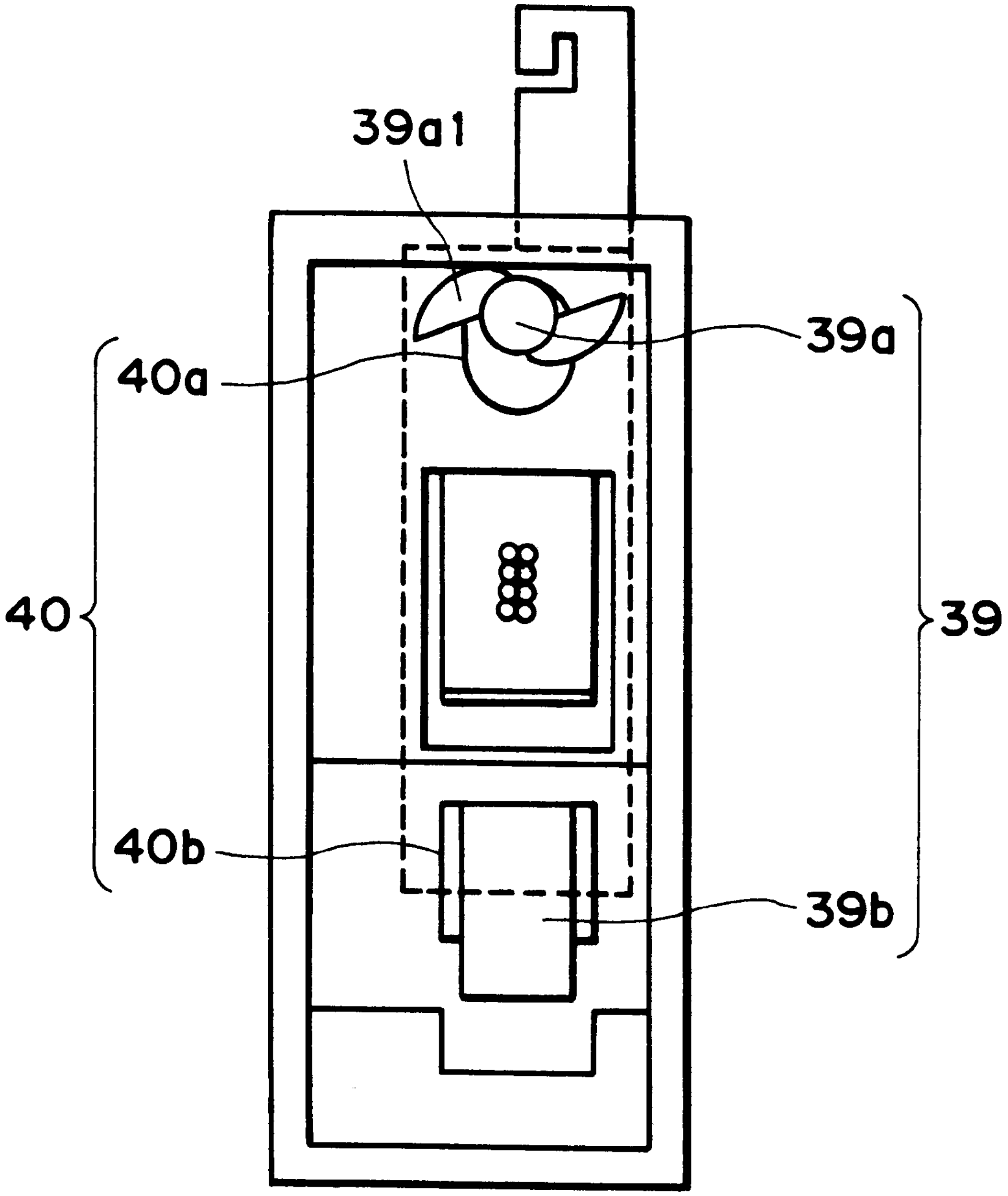
FIG. 25 is an external view of the connector illustrated in FIG. 24, as seen from the direction of an arrow mark 44 in FIG. 24.

Next, the structure which supports the connector 39 will be described with reference to FIG. 24, which is a sectional view of the connector 39 and the connector supporting wall 40, and FIG. 25, which is a plan view of the connector 39 and the connector supporting wall 40 illustrated in FIG. 24, as seen from the direction indicated in FIG. 24 by an arrow mark 44. The connector 39 remains attached to the connector supporting wall 40 since its foot portions 39*a* and 39*b* are shaped to catch the edges of the hole 40*a* and 40*b* of the connector supporting wall 40. The distance 39L from the base of the foot portion 39*a* to the catching point of the foot portion 39*a* is rendered greater than the thickness 40*t* of the connector supporting wall 40, and therefore, the connector 39 is pivotable in the direction of an arrow mark J about the contact point P between the L-shaped portion, that is, the catching portion, of the foot portion 39*b* and the edge of the hole 40*b*. Further, the dimensions of the holes 40*a* and 40*b* of the connector supporting wall 40 are rendered greater than those of the cross sections of the foot portions 39*a* and 39*b* of the connector 39 in the vertical direction as well as in the horizontal direction, and therefore, the connector 39 can move in the vertical direction and also in the horizontal direction. Since the difference in dimension between the holes 40*a* and 40*b* and the cross sections of the foot portions 39*a* and 39*b* is rendered greater in the vertical direction than in the horizontal direction, and therefore, the amount of the movement allowed for the connector 39 is greater in the vertical direction than in the horizontal direction. Since the connector 39 is disposed in an inclined position, and is pulled upward by the tensile coil spring 43 stretched in the vertical direction as illustrated in FIGS. 21 and 24, it is held at the highest portion to which it is allowed to move, and at the same. time, at the farthest position it is allowed to pivot about the contact point P. In this condition, the connector 39 may not perfectly align with the connector portion 117*b* of the process cartridge B guided into the main assembly 14 by the guide portions 16*a* and 16*b*, being different in angle and/or location, but, it is within a range in which the connector portion 117*b* of the process cartridge B can be engaged with the connector 39.

The hole 40*a* in which the foot portion 39*a* fits is a vertically elongated round hole as illustrated in FIG. 24, and the foot portion 39*a* is provided with a catch, which gives when the foot portion 39*a* is put through the hole 40*a*, and snaps back thereafter.

Referring again to FIG. 24, the connector 39 on the main assembly side integrally comprises a connector portion 39*f*, a base portion 39*h*, the foot portions 39*a* and 39*b*, and a boss 39*d*. The connector portion 39*f* is substantially rectangular, and the edge portion 39*g* is chamfered.

Figure 23:
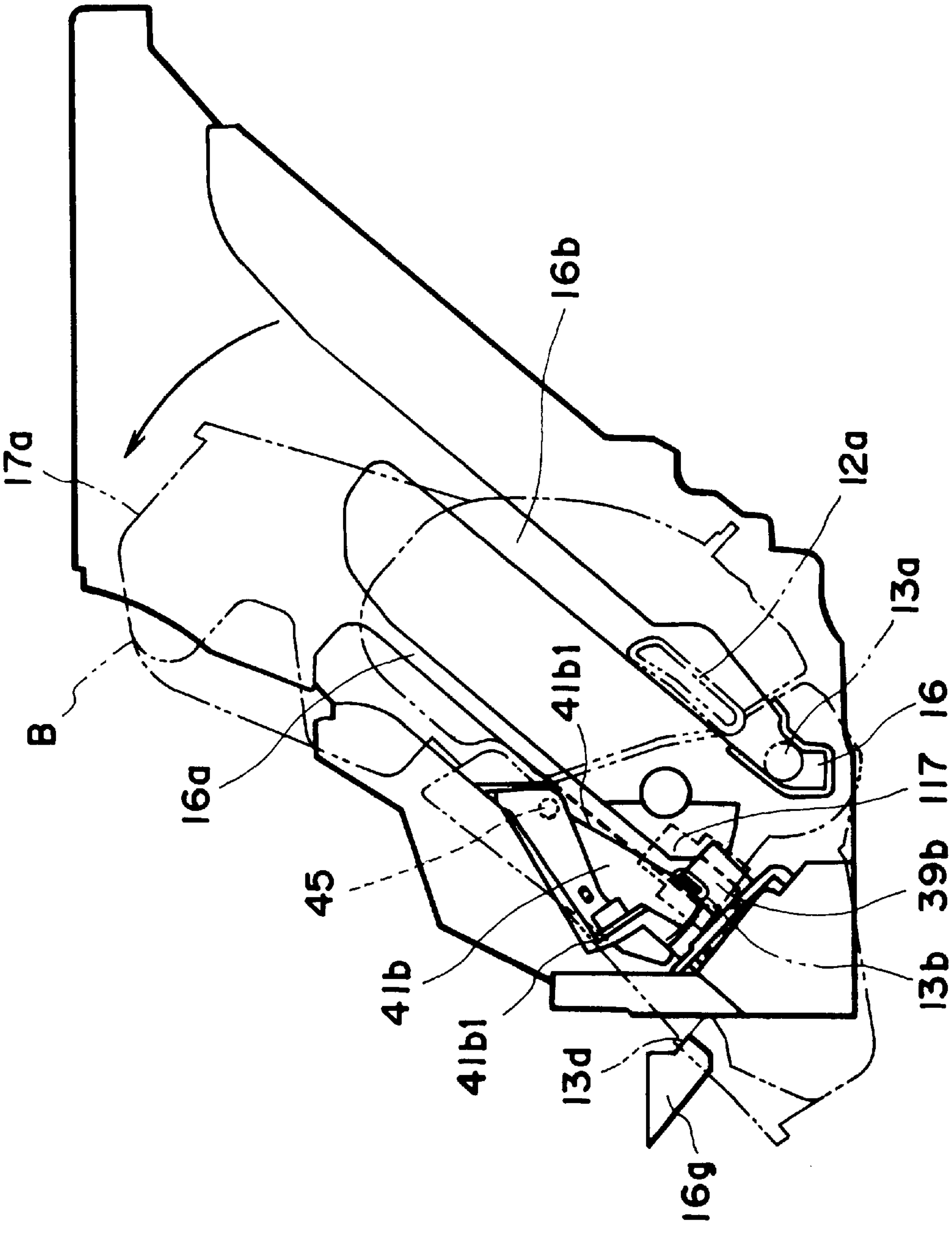
FIG. 23 is a side view of a process cartridge, which depicts one of the stages of cartridge removal.

The foot portions 39*a* and 39*b*, and the boss 39*d* in which lead wires w are placed to be connected to the contacts, are on the opposite side of the base portion 39*h*, relative to the connector portion 39*f*. The connector portion 39*f* which fits in the connector portion 117*b* on the process cartridge B side extends in the direction from which the process cartridge B is inserted. In FIG. 23, the contacts in the connector portion 39*f* are not illustrated. As already described, the foot portion 39*a* of the connector 39 is fitted in the hole 40*a* of the connector supporting wall 40, being allowed to move within a predetermined range in the direction in which the connector 39 is inserted, or pulled out (substantially the same direction as the direction in which the process cartridge B is inserted into the main assembly 14). The foot portion 39*b* is bent, and this bent portion 39*bl* is in contact with the back edge of the hole 40*b*, relative to the direction in which the process cartridge B is inserted into the main assembly 14, at the contact point P. The boss 39*d* is loosely fitted in a hole 40*c* provided in the connector supporting wall 40, between the holes 40*a* and 40*b*. One end of the aforementioned tensile coil spring 43 is attached to the base portion 39*h*, on the side opposite to the foot portion 39*b*, and the other end is anchored to the main assembly 14.

Referring to FIG. 24, when the process cartridge B is not in the main assembly 14, there is a gap between the base portion and the connector supporting wall 40. This gap is in the shape of a wedge which widens from the foot portion 39*b* side toward the foot portion 39*a*. As is evident from the drawing, the holes 40*a*, 40*b* and 40*c* are such that the foot portions 39*a*, 39*b*, and boss 39*d* are allowed to move in the direction indicated by an arrow mark (A), and also in the direction perpendicular thereto; in other words, the connector 39 is allowed to move in all directions.

(Element Damage Preventing Means)

Referring to FIGS. 12 and 21, a reference FIG. 41 designates an element damage preventing means (hereinafter, "ESD shutter"). This ESD shutter is rotatively mounted on the installation guide member 16 with the use of a pivot 45, and prevents the element (memory chip 117*a*) from being damaged by static electricity. It is constituted of a shutter portion 41*a*, which covers the adjacencies of the connector 39, and an opening-closing guide portion 41*b* formed of resin, and is constantly pulled in the direction of an arrow mark 41*c* by a tensile coil spring 42 disposed on the back side of the installation guide member 16.

Figure 20:
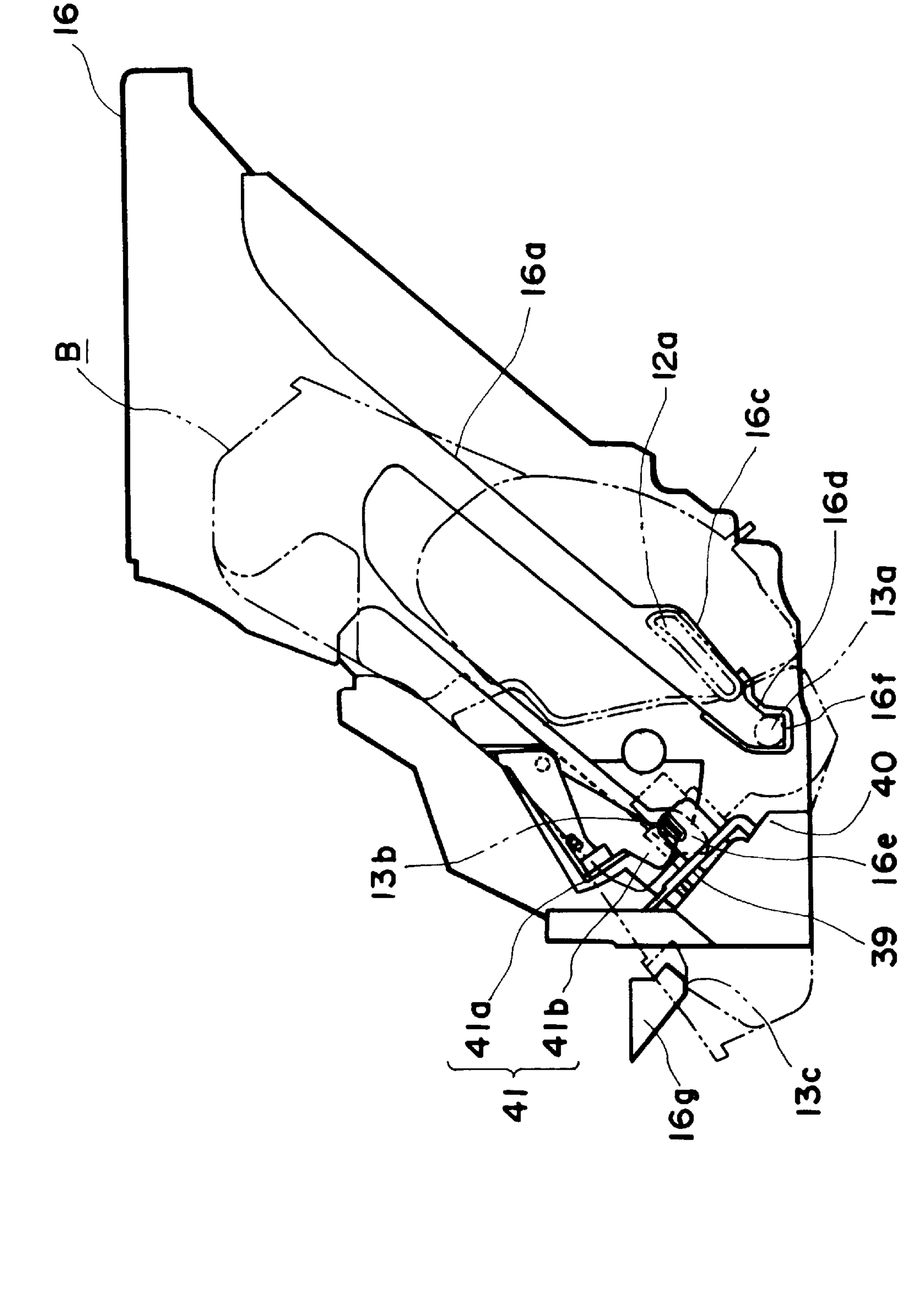
FIG. 20 is a side view of a process cartridge, which depicts one of the stages of cartridge installation.

The shutter member 41*a* is provided with a shutter plate 41*al* which takes two positions: a position at which it squarely faces the connector portion 39*f* of the connector 39 on the main assembly 14 side, and a position at which it exposes the connector portion 39*f*. The opening-closing guide portion 41*b* is provided with a slanted surface 41*bl*, which extends across the guide portion 16*b* of the guide member 16, and is pushed by the short guide 13*b*. It is enabled to rotate about the pivot 45 in the direction of the arrow mark 41*c* against the force of the tensile spring 42, as illustrated in FIG. 20. When the process cartridge B is not in the main assembly 14, the opening-closing guide portion 41*b* is at the position at which it extends across the guide portion 16*b*, being in contact with the installation guide 16 or a stopper portion 46 provided on the frame of the main assembly 14, and therefore, being prevented from rotating. The tensile coil spring 42 is made of metallic material. One end of the tensile coil spring 42 is attached to the shutter member 41, on the side opposite to the shutter plate 41*a*, and the other end is attached to the frame ground of the main assembly 14, the shutter member 41*a* is formed of electrically conductive material, for example, a metallic plate.

Referring to FIG. 21, when the process cartridge B is not in the main assembly 14, the force of the tensile coil spring 42 and the self weight keeps the ESD shutter 41 at the position at which the ESD shutter extends across the groove of the guide portion 16*b* of the installation guide member 16.

(Relationship Between Process Cartridge and Image Forming Apparatus During Cartridge Installation)

Next, the relationship between the installation guide member on the main assembly 14 of an image forming apparatus, and the guide on the process cartridge B side, at the time of process cartridge installation, will be described in detail with reference to the drawings. FIGS. 14–20 are schematic drawings which depict the state of the process cartridge B and the adjacencies thereof from the beginning of the installation until the final positioning of the process cartridge B at a predetermined location. In the drawings, the general profile of the process cartridge B is depicted with the use of a two-dot chain line.

Figure 14:
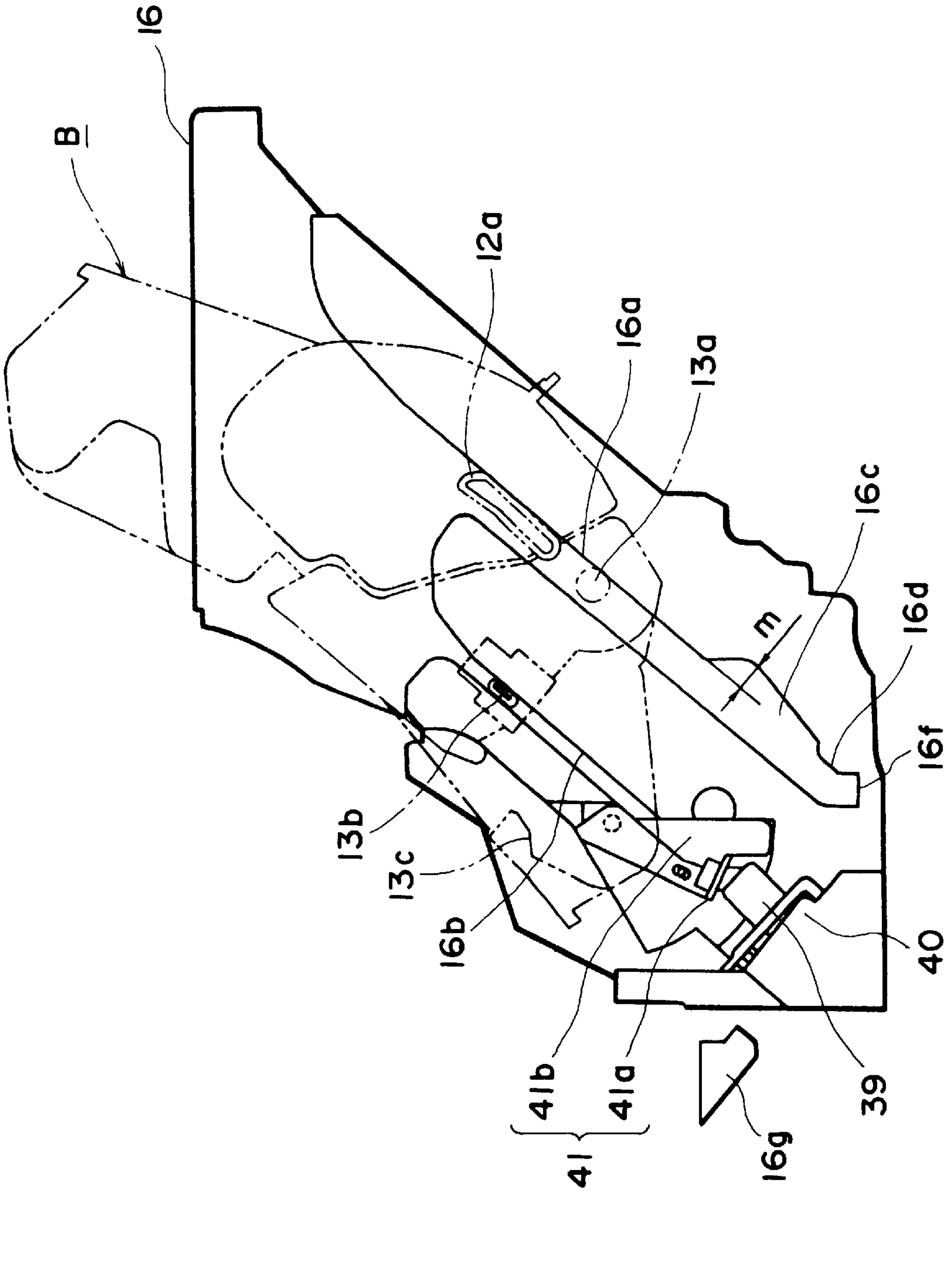
FIG. 14 is a side view of a process cartridge, which depicts one of the stages of cartridge installation.

First, referring to FIG. 14, as the process cartridge B is inserted into the main assembly 14, the dowel 13*a* and the long guide 12*a* of the process cartridge B are guided by the guide portion 16*a*; they slide on the top surface of the guide portion 16*a*. During this initial sliding on the guide portion 16*a*, the dowel 13*a* is not guided by the guide portion 16*b*, being apart by a small distance l from the side surface of the bottom side of the guide portion 16*b*.

Figure 15:
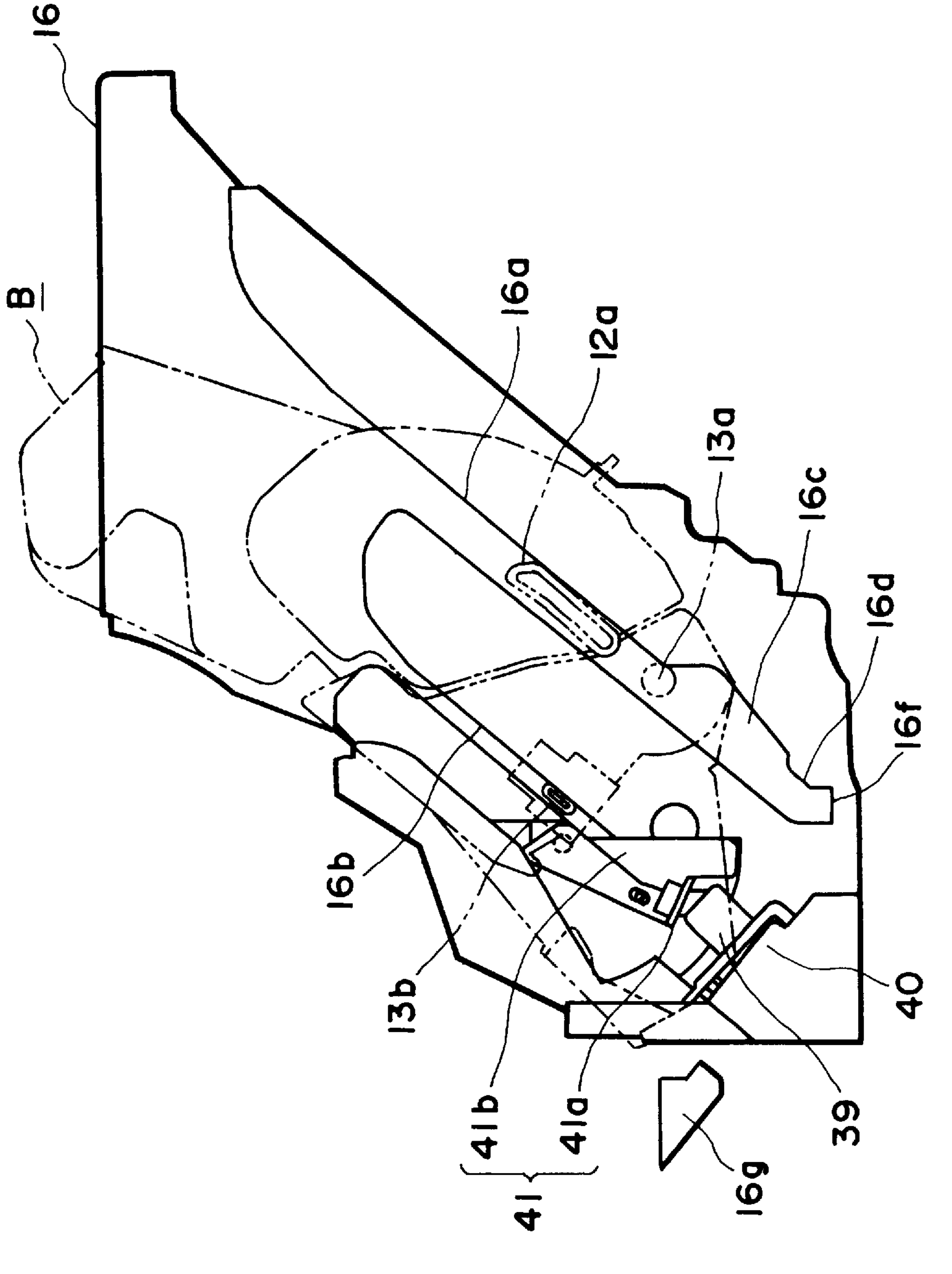
FIG. 15 is a side view of a process cartridge, which depicts one of the stages of cartridge installation.
Figure 18:
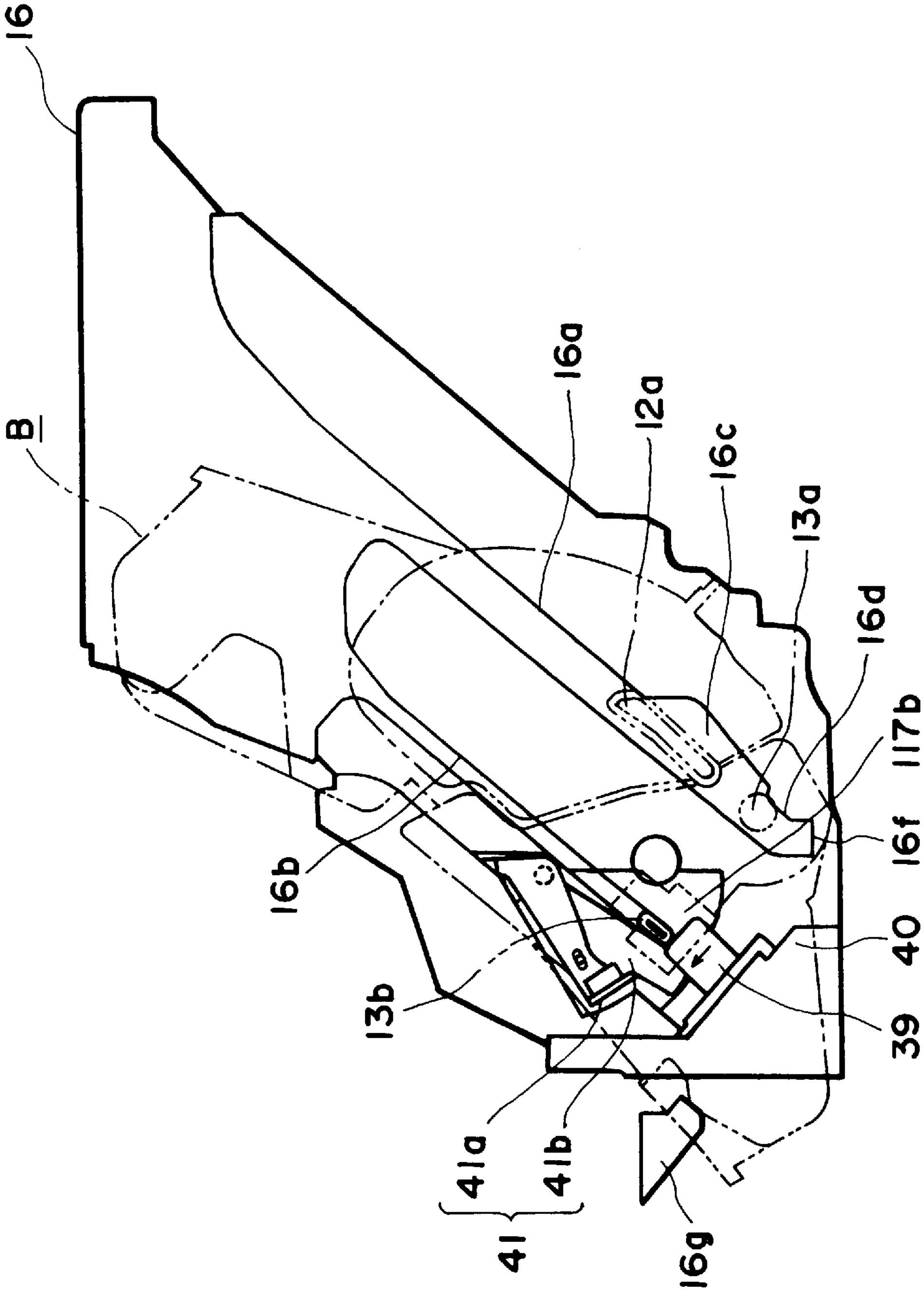
FIG. 18 is a side view of a process cartridge, which depicts one of the stages of cartridge installation.

As the process cartridge B is inserted as far as the location illustrated in FIG. 15, the dowel 13*a* reaches a recess 16*c* of the installation guide member 16. The recess 16*c* of the installation guide 16 is where the long guide 12*a* is allowed to settle as the process cartridge B reaches the predetermined destination (FIG. 18). The depth of the recess 16*c* is rendered greater than the aforementioned distance l (l<m).

Figure 16:
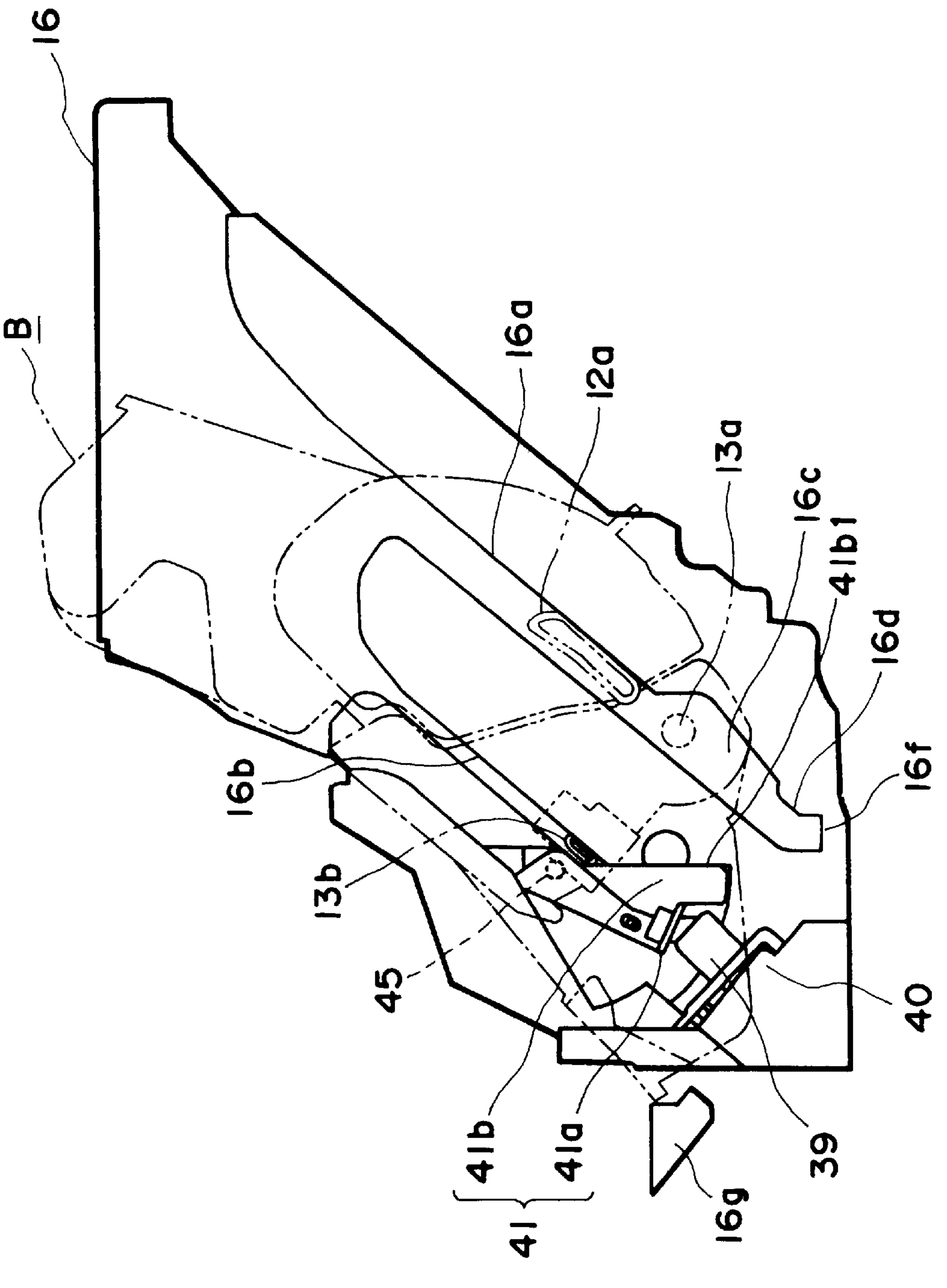
FIG. 16 is a side view of a process cartridge, which depicts one of the stages of cartridge installation.
Figure 17:
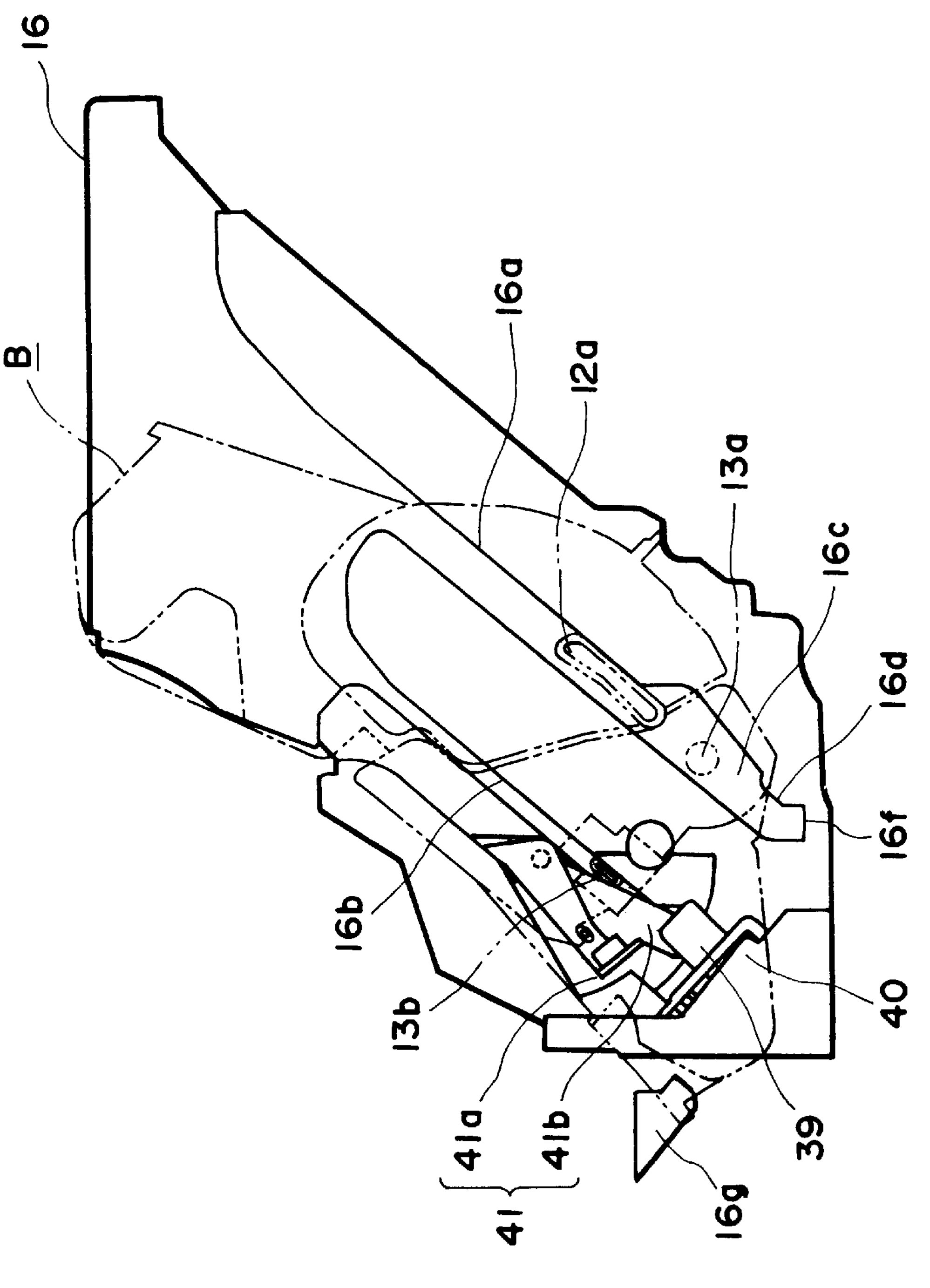
FIG. 17 is a side view of a process cartridge, which depicts one of the stages of cartridge installation.

Next, as the process cartridge B is inserted to the location illustrated in FIG. 16, the short guide 13*b* comes in contact with the slanted surface 41*bl* of the opening-closing guide portion 41*b* of the ESD shutter 41, and pushes the slant surface 41*bl*. As the process cartridge B is inserted farther, with the dowel 13*a* pushing the slant surface 14*bl*, the ESD shutter rotates clockwise against the force of the tensile coil spring 42 until it completely moves away from the installation path for the process cartridge B as shown in FIG. 17. Meanwhile, the short guide 13*b* comes in contact with the guide portion 16*b* before the dowel 13*a* reaches the bottom of the recess 16*c*, and therefore, the long guide 12*a* and the dowel 13*a* take over the role of guiding the process cartridge B. Therefore, the process cartridge B is inserted in a substantially straight line, while reducing the shock to which the process cartridge B is subjected at where the surface of the guide i16*a* of the installation guide member 16 drops to a lower level.

As the process cartridge B is farther inserted to the location illustrated in FIG. 18, the connector portion 117*b* on the process cartridge B side makes contact with the interface connector 39 on the main assembly 14 side since the ESD shutter is completely moved out by the time the process cartridge B has reached this far. As the process cartridge B is farther inserted, the interface connector 39 is rotated against the force of the tensile coil spring 43 by the advancing connector portion 117*b* of the process cartridge B, becoming aligned with the connecting portion 117*b* interface connector 39. Then, the connector portion 117*b* of the process cartridge B and the interface connector 39 begin to fully engage with each other. Meanwhile, the long guide 12*a* of the process cartridge B comes to the recess 16*c* of the aforementioned installation guide member 16. From this point, the dowel 13*a* of the process cartridge B rides on the guide portion 16*d*, and the dowel 13*a* and the short guide 13*b* take over the role of guiding the process cartridge B.

Figure 19:
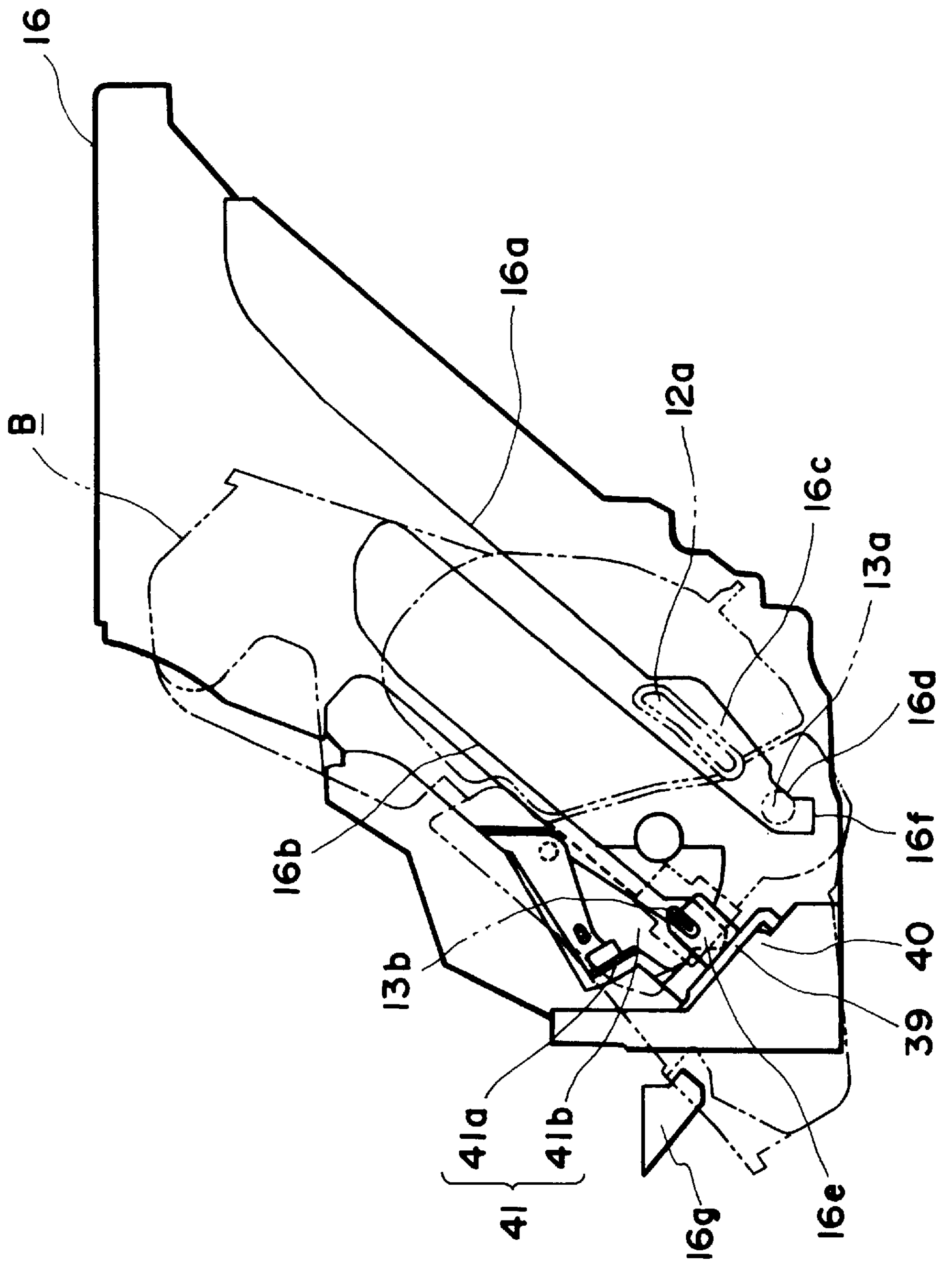
FIG. 19 is a side view of a process cartridge, which depicts one of the stages of cartridge installation.

As the process cartridge B is inserted to the position illustrated in FIG. 19, the connector portion 117*b* of the process cartridge B and the interface connector 39 on the main assembly side are engaged in a straight line since the interface connector 39 on the main assembly 14 side is already aligned with the connector 117*b* of the process cartridge B side. During this movement of the process cartridge B, the short guide 13*b* comes to the recess 16*e* of the installation guide member 16. During the short time it takes for the short guide 13*b* to slide into the recess 16*e*, only the dowel 13*a* rides the guide portion 16*d*, and settles into the positioning portion 16*f*, that is, the groove of the installation guide member 16, at the end of the guide portion 16*d* (FIG. 20). During this last stage of the process cartridge B installation, the dowel 13*a* slightly rotates clockwise in the positioning portion 16*f*, in other words, the process cartridge B slightly rotates clockwise about the dowel 13*a*, since the rear end portion of the process cartridge B relative to the installation direction, that is, the development unit side of the process cartridge B, is heavier than the cleaning unit side. With this rotational movement of the process cartridge B, the connector 39 on the main assembly side is rotated clockwise, following the memory means 117 on the process cartridge B side, by the force of the tensile coil spring 43. Then, the movement of the process cartridge B is stopped, that is, the process cartridge B is precisely positioned in the main assembly 14, as the rotation regulating recessed portion 13*c* of the cleaning frame 13 is caught by the rotation regulating portion 16*g* (FIG. 20) on the main assembly 14 side. Also during this final movement of the process cartridge B, the interface connector 39 on the main assembly 14 side slides downward while rotating in synchronism with the movement of the process cartridge B as described above. In this state, the process cartridge B is in contact with the main assembly 14 only at its rotational center (dowel 13*a*); the other guiding members (long guide 12*a* and short guide 13*b*) are not in contact with any part of the installation guide member 16 on the main assembly side.

As for the positional relationship between the rotation regulating recessed portion 13*c* and the rotation regulating portion 16*g*, they are oriented to squarely take the moment generated in the process cartridge B as the process cartridge B is driven. The distances between the rotation regulating recessed portion 13*c* and the center of the dowel 13*a*, and between the rotation regulating portion 16*g* and the center of the dowel 13*a*, are rendered longer than the distances between the long guide 12*a* and the center of the dowel 13*a*, and between the short guide 13*b* and the center of the dowel 13*a*. Therefore, the process cartridge B remains better stabilized.

In order to remove the process cartridge B from the main assembly 14, the following steps are taken. First, as the process cartridge B in the state illustrated in FIG. 22 is lifted in the direction indicated by an arrow mark in FIG. 23, the removal contact portion 13*d* comes in contact with the rotation regulating portion 16*g*, on the top right surface, relative to the direction perpendicular to the process cartridge installation direction, and the dowel 13*a* comes out of the positioning portion 16*f* as it is pivoted about the contact point between the removal contact portion 13*d* and the rotation regulating portion 16*g*. During this lifting of the process cartridge B, the interface connector 39 is rotated about the contact point P in a manner to be moved away from the connector supporting wall 40 while being shifted in the upper left direction, with the memory means 117 still remaining engaged with the connector portion 39*f* of the interface connector 39. As the process cartridge B is farther lifted, the dowel 13*a* and long guide 12*a* of the process cartridge B are guided upward by the guide portions 16*a*, respectively, and the opening-closing guide portion 41*b* is rotated counterclockwise about the pivot 45 by the force of the tensile coil spring 42, causing the shutter plate 41*al* to cover the connector portion 39*g* of the interface connector 39. Then, the rotation of the opening-closing guide portion 41*b* is stopped by the stopper portion 46. Thereafter, the dowel 13*a* separates from the slant surface 41*bl* of the opening-closing guide portion 41*b*, and is guided upward following the guide portion 16*b*. Thus, the process cartridge B is removed from the main assembly 14 of an image forming apparatus.

The process cartridge mentioned in the preceding description of the embodiments of the present invention is such a process cartridge that comprises an electrophotographic photosensitive drum and at least one processing means. In other words, the present invention is applicable not only to process cartridges such as the process cartridge described above, but also to process cartridges in which an electrophotographic photosensitive member and charging means are integrally disposed, process cartridges in which an electrophotographic photosensitive member and developing means are integrally disposed, process cartridges in which an electrophotographic photosensitive member and cleaning means are integrally disposed, as well as process cartridges in which a combination of an electrophotographic photosensitive member and two or more processing means are integrally disposed.

As described above, according to the present invention, the direction in which a connector with a memory element is inserted, and the direction in which a process cartridge is inserted into the main assembly of an image forming apparatus are rendered substantially the same, and therefore, the connector is desirably connected during the process cartridge insertion. Further, the connector with a memory element is disposed on the straight line which is drawn through the positioning center of the process cartridge, perpendicular to the direction of the process cartridge insertion, and therefore, the angular misalignment which occurs between the connector on the main assembly side of an image forming apparatus, and the connector on the process cartridge side, due to the rotational movement of the process cartridge during the installation, is minimized. Further, the connector is positioned between the positioning center of the process cartridge, and the cartridge removal contact portion, the contact point between which and the process cartridge acts as the fulcrum for the process cartridge at the time of the process cartridge removal. Therefore, whether when inserting or removing the process cartridge, the angular misalignment between the connector on the process cartridge side and the connector on the main assembly side becomes a minimum.

The connector with a memory element is disposed on the same side as the positional reference for the process cartridge in terms of the longitudinal direction of the rotational axis of the electrophotographic photosensitive member of the process cartridge. Therefore, the positional accuracy for the connector with a memory element is improved.

Also in terms of the longitudinal direction of the rotational axis of the electrophotographic photosensitive drum of the process cartridge, the connector with a memory element is disposed at a location substantially equivalent to the location at which the gear for rotating the electrophotographic photosensitive drum is disposed. More specifically, the gear for rotating the electrophotographic photosensitive member is on the outward side of the electrophotographic photosensitive drum, that is, on the outward side of the waste toner chamber, and the connector with a memory element is disposed within the space which the gear for rotating the electrophotographic photosensitive member takes up in terms of the longitudinal direction of the process cartridge. Therefore, it is unnecessary to sacrifice the waste toner chamber and/or the size increase, caused by the connector with a memory element, is minimized.

Further, the connector on the process cartridge side and the connector on the side of the main assembly of an image forming apparatus are connected with each other just before the process cartridge begins to be rotated to be finally locked into the designated position in the main assembly of an image forming apparatus; the connectors are fully engaged before the final positioning of the process cartridge. Therefore, a reliable electrical connection is assured between the memory and the main assembly of an image forming apparatus.

In essence, the present invention assures that a reliable electrical connection is established between a memory element provided in a process cartridge and the main assembly of an image forming apparatus when a process cartridge is installed into the main assembly of an image forming apparatus.

While the invention has been described with reference to the structures disclosed herein, it is not confined to the details set forth and this application is intended to cover such modifications or changes as may come within the purposes of the improvements or the scope of the following claims.

What is claimed is:

1. A process cartridge which is detachably mountable to a main assembly of an electrophotographic image forming apparatus, wherein the main assembly of said apparatus is provided with a main assembly connector and a shutter movable between a covering position wherein the shutter is opposed to said main assembly connector and a retracted position wherein the shutter is retracted from the covering position, said process cartridge comprising:

an electrophotographic photosensitive member;

process means for performing a process and being actable on said photosensitive member;

a cartridge connector having memory means for storing data, said cartridge connector being electrically connectable with said main assembly connector;

wherein said cartridge connector is disposed above a positioning member and a moving member for moving, together with mounting of said process cartridge to the main assembly, the shutter from the covering position to the retracted position to electrically connect the main assembly connector with said cartridge connector when said process cartridge is mounted to the main assembly.

2. A process cartridge according to claim 1, wherein the positioning member is a cartridge a positioning member, wherein said process cartridge further comprising the cartridge positioning member disposed coaxially with said photosensitive member and engageable with a main assembly positioning member provided in the main assembly.

3. A process cartridge according to claim 2, further comprising a regulating portion contactable to a fixed portion of said main assembly to regulate rotation of said process cartridge about said positioning member when said process cartridge is mounted to the main assembly.

4. A process cartridge according to claim 3, wherein said regulating portion is disposed in front of and above said positioning member with respect to a mounting direction of said process cartridge, and wherein said connector is disposed substantially between said positioning member and said regulating member with respect to the mounting direction of said process cartridge.

5. A process cartridge according to claim 1 or 4, wherein said cartridge connector is disposed such that a connecting direction of said cartridge connector is substantially codirectional with the mounting direction of said process cartridge.

6. A process cartridge according to claim 1, 2, 3, or 4, wherein said cartridge connector is mounted on a cleaning frame for supporting said photosensitive member.

7. A process cartridge according to claim 1, wherein said cartridge connector is fixed in a through hole penetrated through a cleaning frame substantially codirectionally with a mounting direction of the process cartridge, wherein said cleaning frame supports said photosensitive member.

8. A process cartridge according to claim 3, wherein said cartridge connector is disposed above said positioning member on a line passing through a center of said positioning member and substantially perpendicular to a mounting direction of said process cartridge to the main assembly.

9. A process cartridge according to claim 1, wherein said process cartridge is detachably mountable to the main assembly in a direction substantially perpendicular to an axis of the electrophotographic photosensitive member, said process cartridge further comprising a releasing contact portion, contactable to a fixed member of the main assembly, for functioning as a pivot when said the process cartridge is demounted from the main assembly, and wherein the releasing contact portion is disposed obliquely above said positioning member as seen in the mounting direction of the process cartridge, and wherein said cartridge connector is disposed substantially between said positioning member and said releasing contact portion.

10. A process cartridge according to claim 1 to 4, 7, 8 or 9, wherein said photosensitive member is provided at its end with the drum gear which is for meshing engagement with a driving gear provided in the main assembly, and said cartridge connector is disposed substantially at the same position as the drum gear in a longitudinal direction of said photosensitive member.

11. A process cartridge according to claim 10, wherein the memory means of the cartridge connector is a random-access memory or a read-only memory.

12. A process cartridge of according to claim 10, wherein a wall member of a cleaning frame supporting said photosensitive member is between said cartridge connector and said drum gear.

13. A process cartridge according to claim 1 to 4, 7, 8 or 9, wherein said cartridge connector comprises a mounting portion for mounting the memory means, a connector portion for electrical connection with the main assembly, a fixing portion for fixing the memory means to said process cartridge, and a protecting capping portion for protecting the memory means from electrical leakage.

14. A process cartridge according to claim 1 to 4, 7, 8 or 9, wherein said process means comprises at least one of charging means, developing means and cleaning means as said process means.

15. An electrophotographic image forming apparatus for forming an image on a recording material, to which a process cartridge is detachably mountable, said apparatus comprising:

(a) main assembly connector;

(b) a shutter movable between a covering position wherein the shutter is opposed to said main assembly connector and a retracted position wherein the shutter is retracted from the covering position;

(c) mounting means for detachably mounting the process cartridge, which includes:

an electrophotograhic photosensitive member, process means for performing a process and being actable on said photosensitive member;

a cartridge connector having memory means for storing data, said cartridge connector being electrically connectable with said main assembly connector;

wherein said cartridge connector is disposed above a positioning member; and a moving member for moving, together with mounting of said process cartridge to the main assembly, the shutter from the covering position to the retracted position to electrically connect the main assembly connector with said cartridge connector when said process cartridge is mounted to the main assembly; and (d) feeding means for feeding the recording material.

16. An apparatus according to claim 15, wherein the main assembly connector is movable.

17. An apparatus according to claim 15 or 16, wherein said main assembly connector is urged by an elastic force of an elastic member.

18. A process cartridge according to claim 5, wherein said cartridge connector is disposed such that a connecting direction of such cartridge connector is substantially codirectional with the mounting direction of said process cartridge.

19. A process cartridge according to claim 5, wherein said photosensitive member is provided at its end with the drum gear which is for meshing engagement with a driving gear for the main assembly, and said cartridge connector is disposed substantially at the same position as the drum gear in the longitudinal direction of said photosensitive member.

20. A process cartridge according to claim 6, wherein said photosensitive member is provided at its end with the drum gear which is for meshing engagement with a driving gear for the main assembly, and said cartridge connector is disposed substantially at the same position as the drum gear in a longitudinal direction of said photosensitive member.

21. A process cartridge according to claim 5, wherein said cartridge connector comprises a mounting portion for mounting the memory means, a connector portion for electrical connection with the main assembly, a fixing portion for fixing the memory means to said process cartridge, and a protecting capping portion for protecting the memory means from electrical leakage.

22. A process cartridge according to claim 6, wherein said cartridge connector comprises a mounting portion for mounting the memory means, a connector portion for electrical connection with the main assembly, a fixing portion for fixing the memory means to said process cartridge, and a protecting capping portion for protecting the memory means from electric leakage.

23. A process cartridge according to claim 10, wherein said cartridge connector comprises a mounting portion for mounting the memory means, a connector portion for electrical connection with the main assembly, a fixing portion for fixing the memory means to said process cartridge, and a protecting capping portion for protecting the memory means from electrical leakage.

24. A process cartridge according to claim 5, wherein said process means comprises at least one of charging means, developing means and cleaning means as said process means.

25. A process cartridge according to claim 6, wherein said process means comprises at least one of charging means, developing means and cleaning means as said process means.

26. A process cartridge according to claim 10, wherein said process means comprises at least one of charging means, developing means and cleaning means as said process means.

* * * * *

UNITED STATES PATENT AND TRADEMARK OFFICE

CERTIFICATE OF CORRECTION

PATENT NO. : 6,097,906

DATED : August 1, 2000

INVENTOR(S): HIROOMI MATSUZAKI, ET AL.

It is certified that error appears in the above-identified patent and that said Letters Patent is hereby corrected as shown below:

COLUMN 1:
Line 19, "process cartridge" should read –term "process cartridge" refers to--.
Line 21, "is" should read –are--.

COLUMN 5:
Line 64, "in" should be deleted.

COLUMN 6:
Line 29, "is" should be deleted.
Line 44, "he" should read –the--.

COLUMN 7:
Line 36, "in" should be deleted.
Line 52, "since" should read –Since--.
Line 56, "5" should read –B--.

COLUMN 9:
Line 7, "referential FIG." should read –reference numeral--.
Line 40, "Since the" should read –Still further, the--.
Line 50, "same." should read –same--.

UNITED STATES PATENT AND TRADEMARK OFFICE
CERTIFICATE OF CORRECTION

PATENT NO. : 6,097,906

DATED : August 1, 2000

INVENTOR(S): HIROOMI MATSUZAKI, ET AL. Page 2 of 2

It is certified that error appears in the above-identified patent and that said Letters Patent is hereby corrected as shown below:

COLUMN 14:
Line 64, "comprising" should read –comprises--.

COLUMN 15:
Line 55, "of" should be deleted.

Signed and Sealed this

Twenty-second Day of May, 2001

Attest:

NICHOLAS P. GODICI

*Attesting Officer* *Acting Director of the United States Patent and Trademark Office*